(12) United States Patent
Thomas et al.

(10) Patent No.: US 12,315,698 B2
(45) Date of Patent: May 27, 2025

(54) PLASMA PROCESSING METHOD AND PLASMA PROCESSING APPARATUS

(71) Applicant: TOKYO ELECTRON LIMITED, Tokyo (JP)

(72) Inventors: Cedric Thomas, Miyagi (JP); Shihchin Lee, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 41 days.

(21) Appl. No.: 17/313,180

(22) Filed: May 6, 2021

(65) Prior Publication Data
US 2021/0358715 A1 Nov. 18, 2021

(30) Foreign Application Priority Data

May 14, 2020 (JP) .................................. 2020-085140
Jan. 22, 2021 (JP) .................................. 2021-008470

(51) Int. Cl.
*H01L 21/306* (2006.01)
*H01J 37/32* (2006.01)
*H01L 21/3065* (2006.01)

(52) U.S. Cl.
CPC ..... *H01J 37/32146* (2013.01); *H01J 37/3211* (2013.01); *H01J 37/32155* (2013.01); *H01J 37/32715* (2013.01); *H01L 21/3065* (2013.01); *H01J 2237/334* (2013.01)

(58) Field of Classification Search
CPC ........... H01J 37/32146; H01J 37/32155; H01J 37/32137; H01J 37/32165; H01J 37/32174
See application file for complete search history.

(56) References Cited

U.S. PATENT DOCUMENTS

| | | | | |
|---|---|---|---|---|
| 4,808,258 A | * | 2/1989 | Otsubo | H01J 37/32155 438/711 |
| 6,589,437 B1 | * | 7/2003 | Collins | H01J 37/32458 216/68 |
| 2005/0241762 A1 | * | 11/2005 | Paterson | H01J 37/32146 156/345.28 |
| 2010/0130018 A1 | * | 5/2010 | Tokashiki | H01J 37/32174 156/345.48 |
| 2010/0330299 A1 | * | 12/2010 | Moon | C23C 16/515 118/723 R |

(Continued)

FOREIGN PATENT DOCUMENTS

| | | |
|---|---|---|
| JP | 2000-311800 A | 11/2000 |
| JP | 2018-535504 A | 11/2018 |
| KR | 20000060991 A | 10/2000 |

*Primary Examiner* — Luz L Alejandro Mulero
(74) *Attorney, Agent, or Firm* — XSENSUS LLP

(57) ABSTRACT

A plasma processing apparatus includes: a plasma processing chamber; a substrate support disposed in the plasma processing chamber; a source RF generator coupled to the plasma processing chamber, and configured to generate a pulse source RF signal including a plurality of source cycles; and a bias RF generator coupled to the substrate support, and configured to generate a pulse bias RF signal. A transition timing to the bias operating state in each bias cycle is delayed with respect to a transition timing to the source operating state in a corresponding source cycle, the source non-operating period overlaps with the bias non-operating period, and the bias operating period in each bias cycle overlaps with the source operating period in the next source cycle.

6 Claims, 17 Drawing Sheets

(56) References Cited

U.S. PATENT DOCUMENTS

| | | |
|---|---|---|
| 2017/0040174 A1 | 2/2017 | Long et al. |
| 2017/0103871 A1* | 4/2017 | An .................... H01J 37/32146 |
| 2020/0058469 A1* | 2/2020 | Ranjan ................ H01L 21/3065 |
| 2020/0058470 A1* | 2/2020 | Ventzek ............ H01J 37/32146 |

* cited by examiner

*FIG. 4A*  *FIG. 4B*  *FIG. 4C*
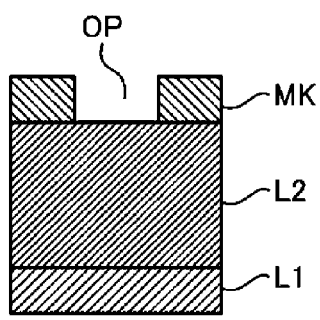
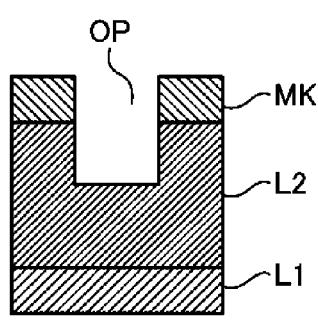
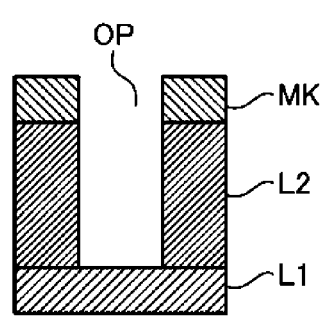

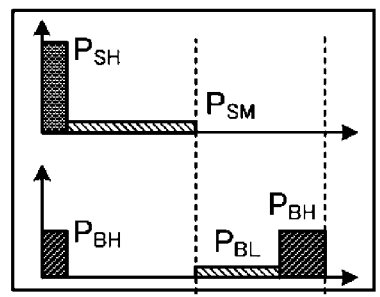
FIG. 9A
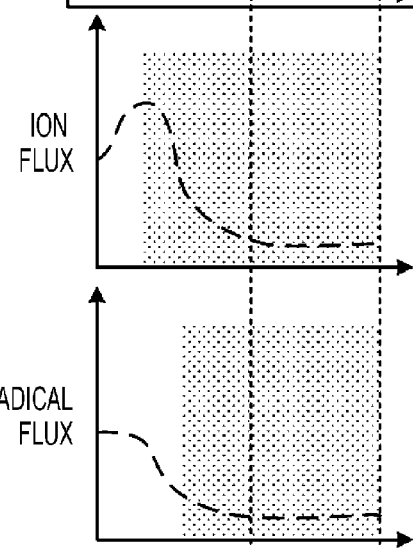
FIG. 9B
FIG. 9C
FIG. 9D
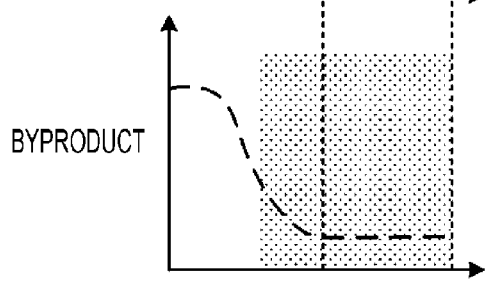
FIG. 9E

PLASMA PROCESSING METHOD AND PLASMA PROCESSING APPARATUS

CROSS-REFERENCE TO RELATED APPLICATIONS

This application is based on and claims priority from Japanese Patent Application Nos. 2020-085140 and 2021-008470, filed on May 14, 2020 and Jan. 22, 2021, respectively, with the Japan Patent Office, the disclosures of which are incorporated herein in their entireties by reference.

TECHNICAL FIELD

The present disclosure relates to a plasma processing method and a plasma processing apparatus.

BACKGROUND

US Patent Laid-Open Publication No. 2017/0040174 discloses a technology of pulsing a radio frequency (RF) signal in an apparatus using inductively coupled plasma (ICP, also referred to as transformer coupled plasma (TCP)). US Patent Laid-Open Publication No. 2017/0040174 discloses that, for example, a source RF signal supplied to a coil and a bias RF signal supplied to a chuck are synchronized such that the pulse sequences are reversed.

SUMMARY

A plasma processing apparatus according to an aspect of the present disclosure includes a plasma processing chamber, a substrate support, a source RF generator, and a bias RF generator. The substrate support is disposed in the plasma processing chamber. The source RF generator is coupled to the plasma processing chamber, and configured to generate a pulse source RF signal including a plurality of source cycles. Each source cycle has a source operating state during a source operating period and a source non-operating state during a source non-operating period after the source operating period. The bias RF generator is coupled to the substrate support, and configured to generate a pulse bias RF signal. The pulse bias RF signal includes a plurality of bias cycles having the same pulse frequency as that of the plurality of source cycles, and each bias cycle has a bias operating state during a bias operating period and a bias non-operating state during a bias non-operating period after the bias operating period. A transition timing to the bias operating state in each bias cycle is delayed with respect to a transition timing to the source operating state in the corresponding source cycle. The source non-operating period overlaps with the bias non-operating period. The bias operating period in each bias cycle overlaps with the source operating period in the next source cycle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are views illustrating an example of a substrate processed by the plasma processing according to the embodiment.

FIGS. 9A to 9E are views for explaining changes of physical quantities in a plasma processing chamber according to Waveform Example 4 of an RF signal.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing a plasma processing apparatus and a plasma processing method according to the present disclosure (hereinafter, referred to as "embodiments") will be described in detail with reference to the drawings. The present disclosure is not limited to the embodiments. Further, the respective embodiments may be appropriately combined within a range that does not contradict the processing contents. Further, in the following

Example of Shape Abnormality That Occurs in Etching

Figure 17A:
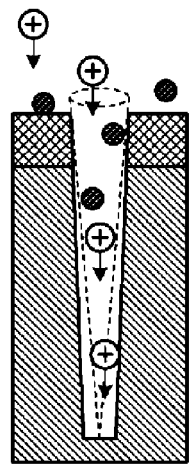
FIGS. 17A to 17C are views for explaining an example of a shape abnormality that occurs in etching.
Figure 17B:
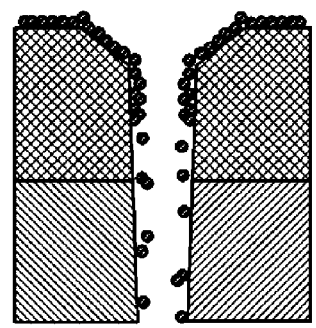
Figure 17C:
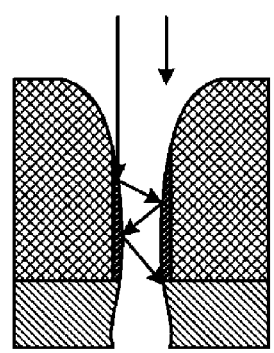

First, descriptions will be made on an example of a shape abnormality that occurs in etching of a silicon film before describing embodiments. FIGS. 17A to 17C are views for explaining the example of the shape abnormality that occurs in the etching of the silicon film.

In recent years, a technology for processing a hole having a high aspect ratio has attracted attention in a semiconductor manufacturing technology. As an example, there is high aspect ratio contact (HARC). HARC is used for a dynamic random access memory (DRAM) or a three-dimensional NAND. The aspect ratio of HARC used for DRAM is, for example, 45, and the aspect ratio of HARC used for a three-dimensional NAND exceeds 65.

As the aspect ratio of the hole to be formed increases, it becomes difficult to form the hole straight in the vertical direction. For example, as illustrated in FIG. 17A, a phenomenon of tapering occurs as it approaches the vicinity of the bottom of the hole. The cause of this phenomenon is considered that, for example, the incident direction of ions in plasma is oblique to the depth direction of the hole, and it is difficult for the ions to be transported to the bottom portion of the hole. Further, it is considered that the ions stay in the holes and disrupts the course of subsequent ions.

Further, as illustrated in FIG. 17B, substances scraped by etching or reaction products produced by plasma may be deposited on the substrate. When these substances are deposited in the vicinity of the hole, the opening of the hole is blocked, so that etching is not proceeded. Further, even when the opening is not completely blocked, it is difficult for ions to reach the inside of the hole, and thus, the shape of the hole is distorted, or etching is not proceeded.

Further, the edge portion of the opening of a mask may be scraped by etching. In this case, as illustrated in FIG. 17C, a phenomenon called bowing in which the incident direction of ions with respect to the hole is distorted and the shape of the hole is distorted in a barrel shape on the side wall of the hole may occur.

As described above, in the plasma processing with a high aspect ratio, the processing performance depends on radicals or ions generated in plasma, and reaction products generated by the plasma processing. As a result, a technology that may individually control, for example, reaction species, radicals, and byproducts in accordance with the progress of a plasma processing is required.

Embodiment

In embodiments described below, each physical quantity, which is a parameter of a plasma processing, is controlled by applying radio frequency (RF) power used at the time of plasma generation in a pulse shape. The controlled physical quantities are, for example, ion energy, an ion incident angle, a radical flux, an ion flux, and an amount of byproducts.

A plasma processing apparatus according to the embodiment described below is an ICP apparatus. A controller of the plasma processing apparatus of the embodiment controls RF power (source RF signal, source power) supplied to a coil (antenna) by a control signal. In the embodiment, high-density plasma is generated by the supply of a source RF signal. The supply of the RF power may be implemented in various aspects. For example, based on a program prepared in advance, the controller of the plasma processing apparatus may switch a power supply path from a plurality of source RF generators, and sequentially supply the source power having different power levels in a pulse shape.

A period during which the RF power is supplied to the coil is called an ON (operating) period, and a period during which the supply of the RF power to the coil is stopped is called an OFF (non-operating) period. The source RF signal has a first state corresponding to the ON period, for example, an ON state (source ON state), and a second state corresponding to the OFF period, for example, an OFF state (source OFF state). The source RF signal is a pulse signal that forms one cycle (source cycle) constituted by an ON period of the first state and an OFF period of the second state that follows. A frequency of the source RF signal may be approximately 1 kHz to approximately 5 kHz.

The source RF signal of the embodiment may transition in two or more levels (e.g., first source power level and second source power level) in the first state. For example, the first state of the source RF signal may have a first level at which the RF power of a predetermined value is supplied to the coil and a second level at which the RF power of a value lower than that of the first level is supplied to the coil. For example, the source RF signal may have a first level at which approximately 1,000 watts of the RF power is supplied to the coil, and a second level at which approximately 250 watts of the RF power is supplied to the coil. The RF power supplied in two levels may be approximately 100 watts or approximately 150 watts. The first level and the second level may be a high level and a low level, respectively.

A controller may further control the RF power (bias RF signal, bias power) supplied to a lower electrode of the plasma processing apparatus by a control signal. In the embodiment, by the supply of the bias RF signal, an ionic bond is caused in a substrate placed above the lower electrode, and reaction species and radicals are generated. The supply of the RF power may be implemented in various aspects. For example, based on a program prepared in advance, the controller of the plasma processing apparatus may switch a power supply path from a plurality of bias RF generators, and sequentially supply the bias power having different power levels in a pulse shape.

A period during which the RF power is supplied to the lower electrode is called an ON period, and a period during which the supply of the RF power to the lower electrode is stopped is called an OFF period. The bias RF signal has a first state corresponding to the ON period, for example, an ON state (bias ON state), and a second state corresponding to the OFF period, for example, an OFF state (bias OFF state). The bias RF signal is a continuous pulse signal that forms one cycle (bias cycle) constituted by an ON period of the first state and an OFF period of the second state that follows. A frequency of the bias RF signal may be approximately 1 kHz to approximately 5 kHz.

The bias RF signal of the embodiment may transition in two or more levels (e.g., first bias power level and second bias power level) in the first state. For example, the first state of the bias RF signal may have a first level at which the RF power of a predetermined value is supplied to the lower electrode and a second level at which the RF power of a value lower than that of the first level is supplied to the lower electrode. For example, the bias RF signal may have the first level at which approximately 250 watts of the RF power is supplied to the lower electrode, and the second level at which approximately 92.5 watts of the RF power is supplied to the lower electrode. The first level and the second level may be a high level and a low level, respectively.

First, an example of a configuration of the plasma processing apparatus that executes the plasma processing will be described below.

Example of Configuration of Plasma Processing Apparatus According to Embodiment

Figure 1:
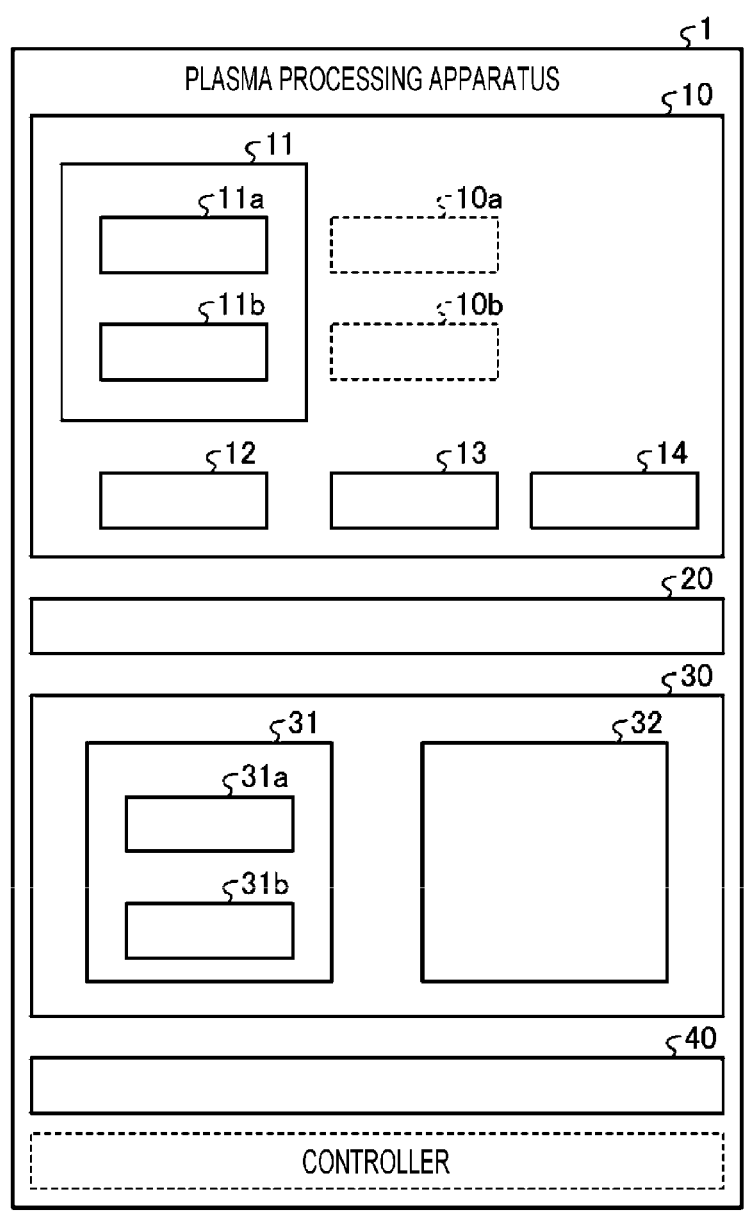
FIG. 1 is a conceptual view of a configuration of a plasma processing apparatus according to an embodiment.
Figure 2:
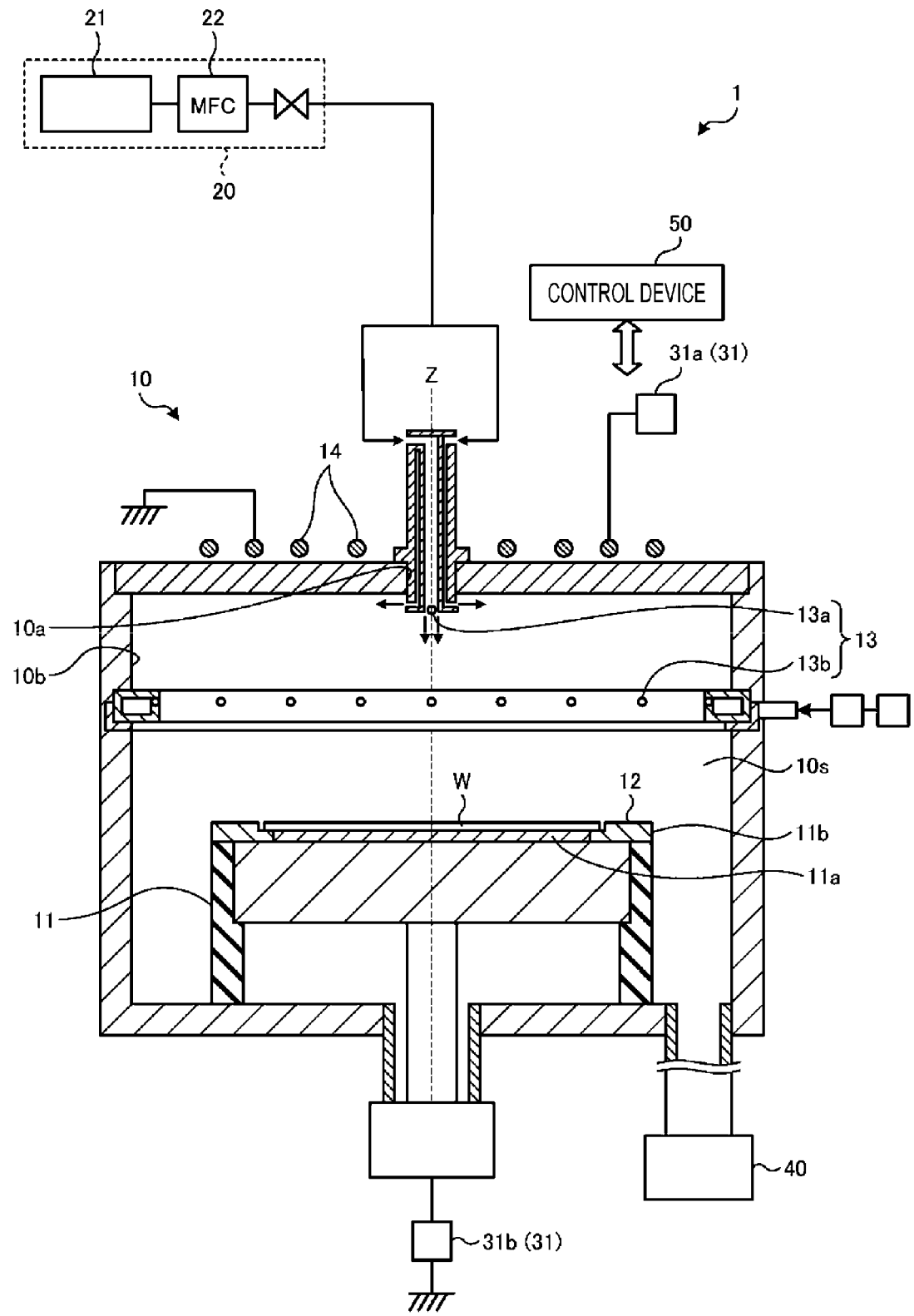
FIG. 2 is a schematic vertical cross-sectional view illustrating an example of the configuration of the plasma processing apparatus in FIG. 1.

FIG. 1 is a conceptual view of a configuration of a plasma processing apparatus according to an embodiment. FIG. 2 is a schematic vertical cross-sectional view illustrating an example of the configuration of the plasma processing apparatus in FIG. 1. A plasma processing apparatus 1 according to an embodiment will be described with reference to FIGS. 1 and 2. The plasma processing apparatus 1 illustrated in FIG. 2 is a so-called inductively-coupled plasma (ICP) apparatus, and generates inductively coupled plasma.

The plasma processing apparatus 1 includes a plasma processing chamber 10, a gas supply 20, a power supply 30, and an exhaust system 40. The plasma processing chamber 10 includes a dielectric window 10a and a side wall 10b. The dielectric window 10a and the side wall 10b define a plasma processing space 10s in the plasma processing chamber 10. Further, the plasma processing apparatus 1 includes a support 11 disposed in the plasma processing space 10s, an edge ring 12, a gas introducer 13, and an antenna 14. The support 11 includes a substrate support 11a and an edge ring support 11b. The edge ring support 11b is disposed to surround an outer peripheral surface of the substrate support 11a. The antenna 14 is disposed on or above the plasma processing chamber 10 (dielectric window 10a).

The substrate support 11a includes a substrate support area, and is configured to support a substrate on the substrate support area. In the embodiment, the substrate support 11a includes an electrostatic chuck and a lower electrode. The lower electrode is disposed below the electrostatic chuck. The electrostatic chuck functions as the substrate support area. Further, although not illustrated, according to the embodiment, the substrate support 11a may include a temperature adjusting module configured to adjust at least one of the electrostatic chuck and the substrate to a target temperature. The temperature adjusting module may include a heater, a flow path, or a combination thereof. A temperature adjusting fluid such as a coolant or a heat transfer gas flows through the flow path.

The edge ring 12 is disposed to surround a substrate W on the upper surface of the peripheral edge portion of the lower electrode. The edge ring support 11b includes an edge ring support area, and is configured to support the edge ring 12 on the edge ring support area.

The gas introducer 13 is configured to supply at least one processing gas from the gas supply 20 to the plasma processing space 10s. In the embodiment, the gas introducer 13 includes a central gas injector 13a and/or a side wall gas injector 13b. The central gas injector 13a is disposed above the substrate support 11a, and is attached to a central opening formed in the dielectric window 10a. The side wall gas injector 13b is attached to a plurality of side wall openings formed in the side wall of the plasma processing chamber 10.

The gas supply 20 may include at least one gas source 21 and at least one flow rate controller 22. In the embodiment, the gas supply 20 is configured to supply one or more processing gases from the corresponding gas sources 21 to the gas introducer 13 via the corresponding flow rate controllers 22. Each flow rate controller 22 may include, for example, a mass flow controller or a pressure-control type flow rate controller. Further, the gas supply 20 may include one or more flow rate modulation devices that modulate or pulse the flow rate of one or more processing gases.

The power supply 30 includes an RF power supply 31 coupled to the plasma processing chamber 10. The RF power supply 31 is configured to supply an RF signal (RF power, e.g., source RF signal and bias RF signal) to the lower electrode and the antenna 14. Therefore, plasma is generated from at least one processing gas supplied to the plasma processing space 10s. In the embodiment, the RF signal is pulsed. Examples of the pulsed RF signal includes a pulse RF signal, pulse RF power, a pulse source RF signal and a pulse bias RF signal.

In the embodiment, the RF power supply 31 includes a source RF generator 31a and a bias RF generator 31b. The source RF generator 31a and the bias RF generator 31b are coupled to the plasma processing chamber 10. In the embodiment, the source RF generator 31a is coupled to the antenna 14, and the bias RF generator 31b is coupled to the lower electrode in the substrate support 11a. The source RF generator 31a is configured to generate at least one source RF signal. In the embodiment, the source RF signal has a frequency in a range of 27 MHz to 100 MHz. The generated source RF signal is supplied to the antenna 14. The bias RF generator 31b is configured to generate at least one bias RF signal. The bias RF signal has a frequency lower than that of the source RF signal. In the embodiment, the bias RF signal has a frequency in a range of 400 kHz to 13.56 MHz. The generated bias RF signal is supplied to the lower electrode. Further, in various embodiments, an amplitude of at least one RF signal of the source RF signal and the bias RF signal may be pulsed or modulated. The amplitude modulation may include pulsing the RF signal amplitude between an ON state and an OFF state, or between two or more different ON states.

Further, the power supply 30 may include a DC power supply 32. In the embodiment, the DC power supply 32 is configured to apply at least one DC voltage to the lower electrode. In the embodiment, at least one DC voltage may be applied to another electrode such as an electrode in the electrostatic chuck. In the embodiment, the DC signal may be pulsed. Further, the DC power supply 32 may be provided in addition to the RF power supply 31, or may be provided instead of the bias RF generator 31b.

The antenna 14 includes one or a plurality of coils (ICP coils). In the embodiment, the antenna 14 may include an outer coil and an inner coil disposed coaxially. In this case, the RF power supply 31 may be coupled to both the outer coil and the inner coil, or may be coupled to any one of the outer coil and the inner coil. In the former case, the same RF generator may be coupled to both the outer coil and the inner coil, or separate RF generators may be separately coupled to the outer coil and the inner coil.

The exhaust system 40 may be connected to, for example, an exhaust port (gas outlet) provided in a bottom portion of the plasma processing chamber 10. The exhaust system 40 may include a pressure valve and a vacuum pump. The vacuum pump may include a turbo molecular pump, a roughing pump, or a combination thereof.

In the embodiment, the controller (corresponding to a control device 50 in FIG. 2) processes computer-executable instructions that cause the plasma processing apparatus 1 to execute the various steps described in the present disclosure. The controller may be configured to control each element of the plasma processing apparatus 1 so as to execute the various steps described here. In the embodiment, a part of or the entire controller may be included in the plasma processing apparatus 1. The controller may include, for example, a computer. The computer may include, for example, a processor (central processing unit: CPU), a storage unit, and a communication interface. The processor may be configured to perform various control operations based on a program stored in the storage unit. The storage unit may include a random access memory (RAM), a read only memory (ROM), a hard disk drive (HDD), a solid state drive (SDD), or a combination thereof. The communication interface may communicate with the plasma processing apparatus 1 via a communication line such as a local area network (LAN).

Flow of Plasma Processing According to Embodiment

Figure 3:
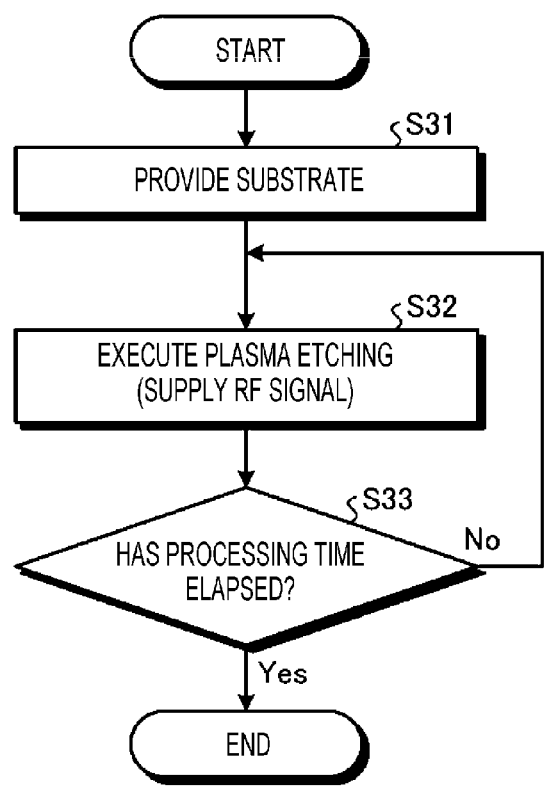
FIG. 3 is a flowchart illustrating an example of a flow of a plasma processing according to the embodiment.

FIG. 3 is a flowchart illustrating an example of a flow of a plasma processing according to the embodiment. The plasma processing illustrated in FIG. 3 may be performed in the plasma processing apparatus 1 in FIGS. 1 and 2. FIGS. 4A to 4C are views illustrating an example of a substrate processed by the plasma processing according to the embodiment.

First, the substrate W is provided in the plasma processing chamber 10 (step S31). For example, as illustrated in FIGS. 4A to 4C, the substrate W includes a base layer L1, an etching target layer (Si layer) L2, and a mask MK sequentially formed on a silicon substrate. A recess OP is formed in the substrate W in advance (see FIG. 4A). The formation of the recess OP may be performed in the plasma processing apparatus 1. Subsequently, the plasma processing apparatus 1 is controlled by the controller so that the gas for etching is supplied from the gas supply 20 into the plasma processing chamber 10. Further, the plasma processing apparatus 1 is controlled by the controller so that the RF power is supplied from the RF power supply 31 (source RF generator 31a and bias RF generator 31b) to the lower electrode and the antenna 14 (coil). At this time, the RF power supply 31 supplies the RF power at a level corresponding to the waveform of the RF signal to the lower electrode and the antenna 14. The waveform of the RF signal will be described later. By supplying the RF power, plasma of the gas supplied into the plasma processing chamber 10 is generated, and plasma etching is executed (step S32). By the plasma etching, the bottom portion of the recess OP formed in the mask MK of the substrate W is scraped, and thus, the recess OP gradually becomes deeper (see FIG. 4B). Then, the controller of the plasma processing apparatus 1 determines whether a predetermined processing time has elapsed (step S33). When a predetermined processing time has elapsed, the bottom portion of the recess OP reaches the base layer L1, and has the shape illustrated in FIG. 4C. When it is determined that the processing time has not elapsed (No in step S33), the controller returns to step S32 and continues the plasma etching. Meanwhile, when it is determined that the processing time has elapsed (Yes in step S33), the controller ends the processing.

The plasma processing apparatus 1 according to the embodiment supplies the source RF signal and the bias RF signal in the plasma etching in step S32. The plasma processing apparatus 1 controls, for example, ions and radicals in the plasma, and an amount of the byproducts generated by the plasma etching according to the source RF signal and the bias RF signal. Subsequently, the waveforms of the source RF signal and the bias RF signal will be described.

Waveform Example of RF Signal

Figure 5:
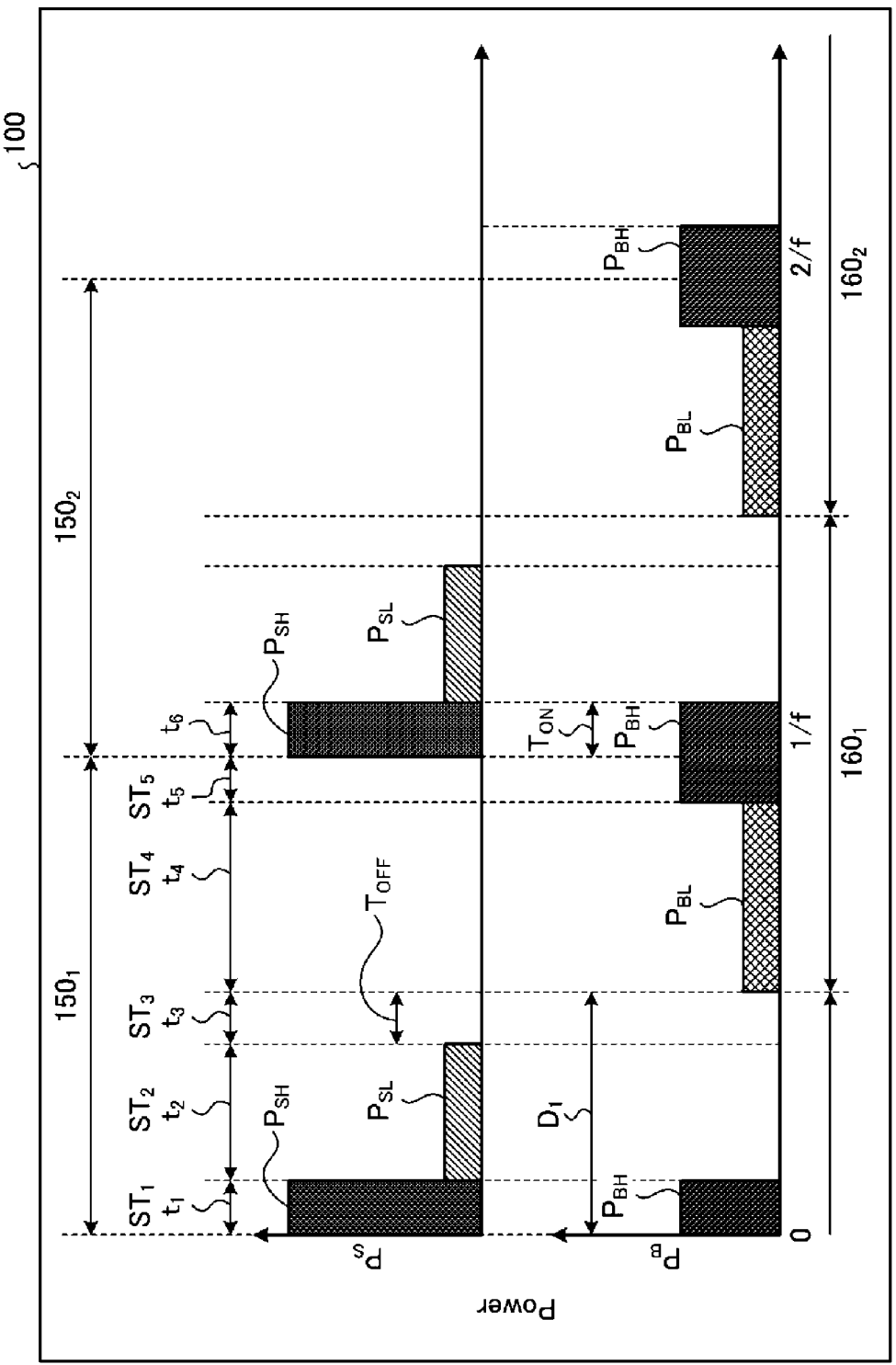
FIG. 5 is a view illustrating a waveform example of a radio frequency (RF) signal used for RF power supply in the plasma processing according to the embodiment.
Figure 6A:
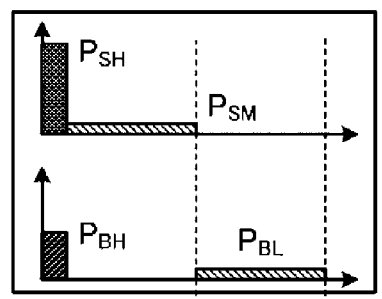
FIGS. 6A to 6E are views for explaining changes of physical quantities in a plasma processing chamber according to Waveform Example 1 of an RF signal.
Figure 6B:
Figure 6C:
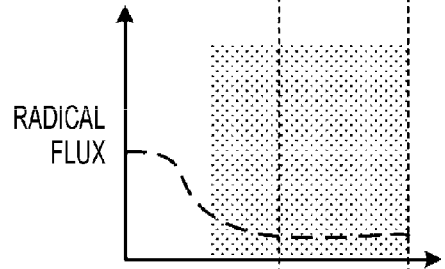
Figure 6D:
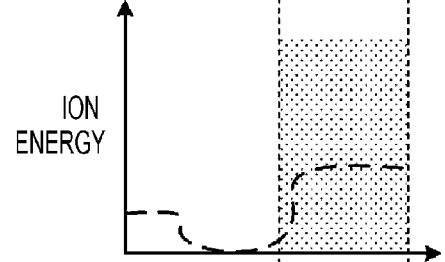
Figure 6E:
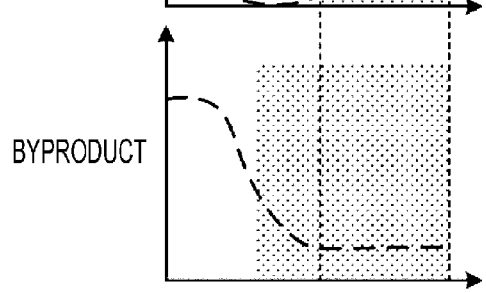

FIG. 5 is a view illustrating a waveform example of the RF signal used for RF power supply in the plasma processing according to the embodiment.

A timing diagram 100 illustrated in FIG. 5 illustrates a source power (source RF signal) $P_S$ and a bias power (bias RF signal) $P_B$. The source power $P_S$ is RF power supplied from the source RF generator 31a to the antenna (coil) 14. Further, the bias power $P_B$ is RF power supplied from the bias RF generator 31b to the lower electrode of the substrate support 11a. The source RF generator 31a generates the source power $P_S$, for example, according to the control signal supplied from the controller. The generated source power $P_S$ is supplied to the coil. The bias RF generator 31b generates the bias power $P_B$, for example, according to the control signal supplied from the controller. The generated bias power $P_B$ is supplied to the lower electrode.

In FIG. 5, a cycle 150 indicates one cycle of the source RF signal. A cycle 160 indicates one cycle of the bias RF signal. In the following description, when it is not necessary to particularly distinguish, cycles $150_1$, $150_2$, . . . are collectively referred to as the cycle 150, and cycles $160_1$, $160_2$, . . . are collectively referred to as the cycle 160. One cycle refers to a period from the rise of the pulse signal to the next rise, that is, the total period of an ON period and an OFF period. The source RF signal and the bias RF signal are pulse signals having the same frequency.

The source RF signal repeats an ON state (first state) during which the RF power is supplied to the coil, and an OFF state (second state) during which the RF power is not supplied to the coil. When the source RF signal is the ON state, the source power $P_S$ is supplied to the coil. When the source RF signal is the OFF state, the power is not supplied to the coil, that is, the supply of the RF power to the coil is stopped.

The bias RF signal repeats the ON state (first state) during which the RF power is supplied to the lower electrode, and the OFF state (second state) during which the RF power is not supplied to the lower electrode. In the example in FIG. 5, when the bias RF signal is the ON state, the bias power $P_B$ is supplied to the lower electrode. When the bias RF signal is the OFF state, the power is not supplied to the lower electrode, that is, the supply of the RF power to the lower electrode is stopped.

In FIG. 5, the rise of the bias RF signal is delayed by a period $D_1$ with respect to the rise of the source RF signal. After the source RF signal has transitioned from an ON state to an OFF state, the bias RF signal rises while the source RF signal is an OFF state. As described above, the timing at which the cycle of the source RF signal is started and the timing at which the cycle of the bias RF signal is started are deviated by the period $D_1$. In the example in FIG. 5, the transition timing from the bias OFF state ($t_3$) in the preceding bias cycle to the bias ON state $P_{BL}$ ($t_3$) in the first bias cycle $160_1$ is delayed with respect to the transition timing to the source ON state $P_{SH}$ (from 0 to $t_1$) in the first source cycle $150_1$ corresponding to the first bias cycle $160_1$. Further, as illustrated by $t_3$ in FIG. 5, the source OFF period partially overlaps with the bias OFF period. Further, as illustrated by $t_6$ in FIG. 5, the bias ON period in the first bias cycle $160_1$ partially overlaps with the source ON period in the second source cycle $150_2$.

Further, the respective lengths of the ON period and the OFF period of the source RF signal are different from the respective lengths of the ON period and the OFF period of the bias RF signal. In the example in FIG. 5, the duty ratio (ratio of the length of the ON period to one cycle) of the source RF signal is approximately 40%. Further, the duty ratio of the bias RF signal is approximately 60%. However, the duty ratios of the source RF signal and the bias RF signal are not limited to the above values. Further, the source RF signal and the bias RF signal may have the same duty ratio.

As described above, the states of the source RF signal and the bias RF signal are individually transitioned. The timing of the state transition, and the power level of the transition source and the transition destination of the source RF signal may be different from the timing of the state transition, and the power level of the transition source and the transition destination of the bias RF signal.

Further, there are a period $T_{OFF}$ during which both the source RF signal and the bias RF signal are not supplied, and a period $T_{ON}$ during which both the source RF signal and the bias RF signal are supplied. The supply aspects of the source power $P_S$ and the bias power $P_B$ change in the following five phases.

(1) First Phase ($ST_1$ in FIG. 5):

A first phase is defined by a parameter set $\{P_{S1}, P_{B1}, \text{and } t_1\}$. Here, $P_{S1}$ is a value of the source power $P_S$ supplied during the first phase. $P_{B1}$ is a value of the bias power $P_B$ supplied during the first phase. $t_1$ refers to a length of the period of the first phase. Here, the following relationships are established.

$P_{S1} > 0$
$P_{B1} > 0$
$t_1 0$

In the first phase, the source power $P_S$ having a High power level $P_{SH}$ (first source power level) is supplied to the coil, and also, the bias power $P_B$ having a High power level $P_{BH}$ (second bias power level) is supplied to the lower electrode. During the period $t_1$ in the first phase, the RF power is supplied to each of the upper portion and the lower portion of the plasma processing apparatus 1 to generate plasma, and ions and radicals are generated in the plasma. During an etching processing, etching is proceeded during the period $t_1$.

(2) Second Phase ($ST_2$ in FIG. 5):

A second phase is defined by a parameter set $\{P_{S2}, P_{B2}, \text{and } t_2\}$. Here, $P_{S2}$ is a value of the source power $P_S$ supplied during the second phase. $P_{B2}$ is a value of the bias power $P_B$ supplied during the second phase. $t_2$ refers to a length of the period of the second phase. Here, the following relationships are established.

$P_{S1} > P_{S2} > 0$
$P_{B2} = 0$
$t_2 > 0$

In the second phase, the source power $P_S$ having a Low power level $P_{SL}$ (second source power level) is supplied to the coil, and the supply of the bias power $P_B$ is stopped. The second phase is, for example, a period $t_2$ in FIG. 5. During the period $t_2$, the RF power is supplied to the upper portion of the plasma processing apparatus 1. Since the RF power is not supplied to the lower electrode side, a force that draws ions is not generated on the lower electrode side. Further, the amounts of ions and radicals generated are also reduced.

(3) Third Phase ($ST_3$ in FIG. 5):

A third phase is defined by a parameter set $\{P_{S3}, P_{B3}, \text{and } t_3\}$. Here, $P_{S3}$ is a value of the source power $P_S$ supplied during the third phase. $P_{B3}$ is a value of the bias power $P_B$ supplied during the third phase. $t_3$ refers to the length of the period of the third phase. Here, the following relationships are established.

$P_{S3} = P_{B3} = 0$
$t_3 > 0$

In the third phase, the supply of both the source power $P_S$ and the bias power $P_B$ is stopped. The third phase is, for example, a period $t_3$ in FIG. 5. During the period $t_3$, the plasma generation in the plasma processing apparatus 1 is stopped and the plasma processing space 10s is exhausted by the function of the exhaust system 40. At this time, byproducts that are generated by etching and are staying at the bottom portion of the recess (OP in FIGS. 4A to 4C) are exhausted. The amounts of ions and radicals in the plasma processing space 10s are also reduced.

(4) Fourth Phase ($ST_4$ in FIG. 5):

A fourth phase is defined by a parameter set $\{P_{S4}, P_{B4}, \text{and } t_4\}$. Here, $P_{S4}$ is a value of the source power $P_S$ supplied during the fourth phase. $P_{B4}$ is a value of the bias power $P_B$ supplied during the fourth phase. $t_4$ refers to a length of the period of the fourth phase. Here, the following relationships are established.

$P_{S4} = 0$
$P_B > P_{B4} > 0$
$t_4 > 0$

In the fourth phase, the supply of the bias power $P_B$ having a Low power level $P_{BL}$ (first bias power level) is started while the supply of the source power $P_S$ is stopped. Since the source power $P_S$ is not supplied during the period $t_4$ in the fourth phase, plasma is not generated, but the ions generated in the first and the second phases remain in the plasma processing space 10s. As a result, the ions are drawn to the bottom portion of the recess (OP in FIGS. 4A to 4C) by the supply of the bias power $P_B$. Further, the incident angle of the ions becomes closer to vertical, and the vertical etching of the recess OP side wall is promoted.

(5) Fifth Phase ($ST_5$ in FIG. 5):

A fifth phase is defined by a parameter set $\{P_{S5}, P_{B5}, \text{and } t_5\}$. Here, $P_{S5}$ is a value of the source power $P_S$ supplied during the fifth phase. $P_{B5}$ is a value of the bias power $P_B$ supplied during the fifth phase. $t_5$ refers to a length of the period of the fifth phase. Here, the following relationships are established.

$P_{S5} = 0$
$P_{B1} = P_{B5} > P_{B4} > 0$
$t_5 > 0$

In the fifth phase, the power level of the bias power $P_B$ rises (transitions) from the Low power level $P_{BL}$ to the High power level $P_{BH}$ while the supply of the source power $P_S$ is stopped. As a result, as a preparing step for the first phase, the ion energy in the plasma processing space 10s increases in the fifth phase. The amount of radicals or byproducts is maintained at the reduced state in the third phase.

After the fifth phase, the processing returns to the first phase, and the source power $P_S$ having the High power level and the bias power $P_B$ having the High power level are superimposed and applied. These cycles are repeated, the first phase is started in a state where ion energy is generated in advance by applying the bias power $P_B$ in the fifth phase, and ions and radicals are generated by applying the source power $P_S$. As a result, the etching in the first phase may be promoted, and ions may be drawn to the bottom portion of the recess OP more efficiently. Further, the etching may further be promoted by exhausting the byproducts in the third phase.

As described above, by using the source RF signal and the bias RF signal having the pulse waveform in FIG. 5, the etching in the vertical direction may be implemented while controlling the states of the ions, the radicals, and the byproducts in the plasma processing space 10s. As a result, the processing performance of the plasm etching may be improved by suppressing the shape abnormality occurred by etching.

However, in the example in FIG. 5, the source power $P_S$ takes the value $P_{SH}$ when the period $t_1$ is an ON state, and takes the value $P_{SL}$ when the following period $t_2$ is an ON state. Further, the bias power $P_B$ takes the value $P_{BL}$ during the period $t_4$, and transitions to the value $P_{BH}$ in the subsequent period $t_5$. As described above, in the plasma processing method according to the embodiment, in order to control each physical quantity of plasma, the ON state of the source RF signal may be controlled in two levels (three levels including an OFF state). Further, in the plasma processing method according to the embodiment, the ON state of the bias RF signal may be controlled in two levels (three levels including an OFF state). As described above, it is possible to further finely adjust parameters of the plasma processing by gradually varying the RF power value applied to each of the coil and the lower electrode.

In the example in FIG. 5, the following relationships are established.

$0<P_{SL}<P_{SH}$ $0<P_{BL}<P_{BH}$

Frequency of source RF signal and bias RF signal: 0.1 kHz to 5 kHz

Duty ratio of source RF signal: approximately 40%

Duty ratio of bias RF signal: approximately 60%

Length of period of $P_{SH}$:Length of period of $P_{SL}$=1:3

Length of period of $P_{BH}$:Length of period of $P_{BL}$=1:2

$t_1:t_2:t_3:t_4:t_5=1:3:1:4:1$

However, the embodiment may be applied not only when the above relationships are established, but also to other relationships. Other relationships will be described later as a modification.

FIGS. 6A to 6E to 9A to 9E are views for explaining changes of physical quantities in the plasma processing chamber 10 according to a waveform example of the RF signal. The changes of the physical quantities according to the waveform of the RF signal will be described with reference to FIGS. 6A to 6E to 9A to 9E.

Waveform Example 1 in FIGS. 6A to 6E has a "first phase" in which the source power and the bias power are supplied at the same time, a "second phase" in which the source power is supplied, and a "fourth phase" in which the bias power is supplied. Comparing to the waveform example in the above embodiment, Waveform Example 1 is different in that it does not have a "third phase" in which the RF power is not supplied, and a "fifth phase" in which the power level of the bias power varies before the rise of the source RF signal. In the case of Waveform Example 1, all of the ion flux, the radical flux, and the ion energy increase in the first phase, and the amount of the byproduct increases at the same time. Thereafter, all amounts gradually decrease in the second phase. The ion energy becomes substantially zero by stopping the supply of the bias power. In the fourth phase, the ion energy becomes larger than that in the first phase due to the supply of the bias power. Meanwhile, the amounts of the ion flux, the radical flux, and the byproduct are not significantly changed from the second phase.

Figure 7A:
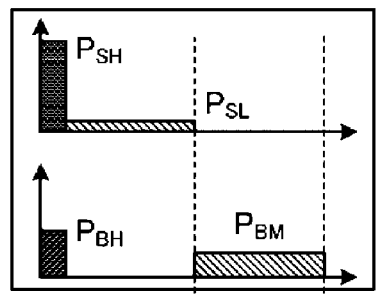
FIGS. 7A to 7E are views for explaining changes of physical quantities in a plasma processing chamber according to Waveform Example 2 of an RF signal.
Figure 7B:
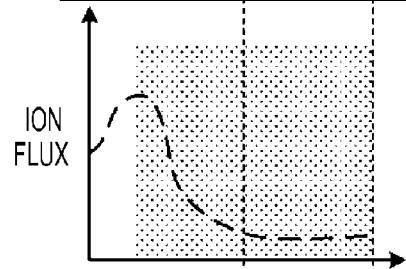
Figure 7C:
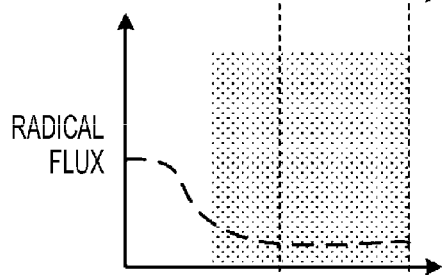
Figure 7D:
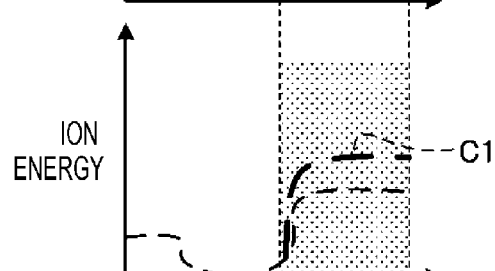
Figure 7E:
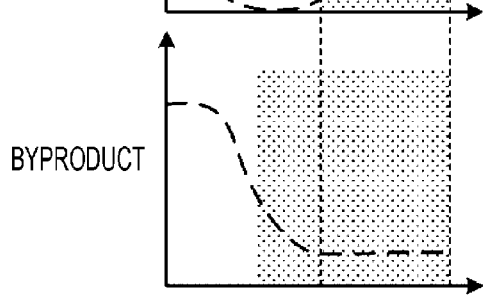
Figure 8A:
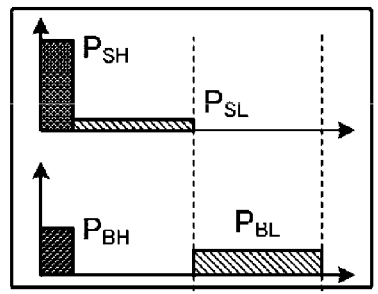
FIGS. 8A to 8E are views for explaining changes of physical quantities in a plasma processing chamber according to Waveform Example 3 of an RF signal.
Figure 8B:
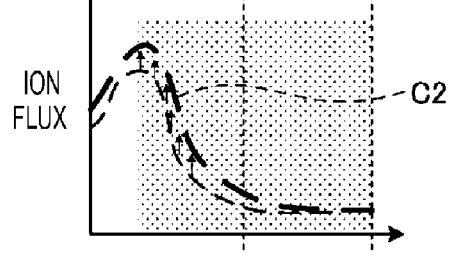
Figure 8C:
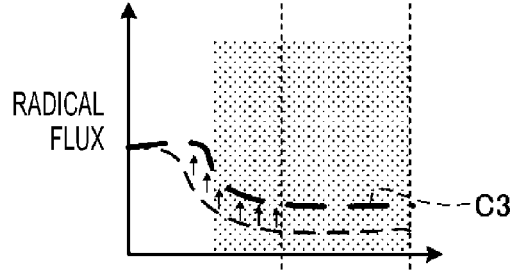
Figure 8D:
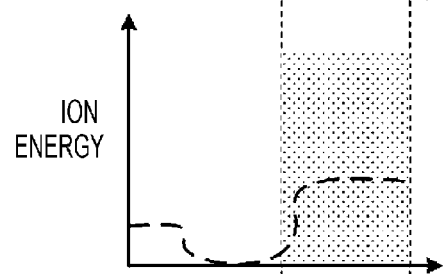
Figure 8E:
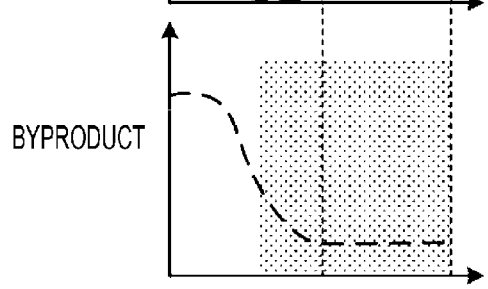

Waveform Example 2 in FIGS. 7A to 7E is substantially the same as Waveform Example 1 in FIGS. 6A to 6E. However, a value $P_{BM}$ of the bias power in the fourth phase increases from the value $P_{BL}$ of the bias power in Waveform Example 1. In the example in FIGS. 7A to 7E, the amounts of the ion flux, the radical flux, and the byproduct are substantially the same as the case of Waveform Example 1 in FIGS. 6A to 6E. However, the ion energy in the fourth phase is increased as compared with Waveform Example 1 (C1 in FIG. 7D). In FIG. 7D, the change of the ion energy in the case of FIG. 7A is illustrated on the same broken line in FIG. 6D by a thick broken line C1 only in a portion different from FIG. 6D.

In Waveform Example 3 in FIGS. 8A to 8E, the first phase is lengthened as compared with Waveform Example 1 in FIGS. 6A to 6E, and the second phase is shortened by that amount. In the example in FIGS. 8A to 8E, the amounts of the ion flux and the radical flux are increased as compared with the example in FIGS. 6A to 6E through the first phase and the second phase (C2 and C3 in FIGS. 8B and 8C). Meanwhile, the amounts of the ion energy and the byproduct are not largely changed. The thick broken lines C2 and C3 indicate the portion different from FIGS. 6B and 6C, similar to the thick broken line C1.

As compared with Waveform Example 1 in FIGS. 6A to 6E, Waveform Example 4 in FIGS. 9A to 9E is different in that the fifth phase is provided. The power level in the fifth phase transitions from the power level $P_{BL}$ in the fourth phase to the power level $P_{BH}$. In the example in FIGS. 9A to 9E, the amounts of the ion flux, the radical flux, and the byproduct are substantially the same as those of Waveform Example 1 in FIGS. 6A to 6E. With respect to the ion energy, it is increased in the fifth phase corresponding to the switching of the bias power $P_B$ in the fifth phase (C4 in FIG. 9D). The thick broken line C4 in FIG. 9D indicates the portion different from FIG. 6D.

When etching is performed using the RF power in the waveform examples illustrated in FIGS. 6A to 6E to 9A to 9E, in Waveform Example 1 and Waveform Example 3, the variation in the dimension (critical dimension) from the top of the recess to the bottom portion of the recess increases as compared with Waveform Example 2. That is, as in the fourth phase in Waveform Example 2, when the bias power having a slightly high level is supplied, a hole having a more uniform size in the longitudinal direction may be formed during deep hole etching. Meanwhile, when the ratio of the length of the first phase and the length of the second phase as in Waveform Example 3, the consumption of the mask is reduced, and the etching target film may be selectively etched. From this aspect, it may be found that the state of ions or radicals in the plasma processing space 10s, particularly in the vicinity of the substrate, which is a processing target, is changed according to the waveform of the RF power, which affects the performance of the plasma processing. As a result, the performance of the plasma processing, that is, the shape of the pattern formed by the plasma processing may be controlled by adjusting the waveform of the RF signal.

Waveform Examples 1 to 4 in FIGS. 6A to 6E to 9A to 9E do not have the third phase of the embodiment, that is, the phase in which the RF power is not supplied to either the coil or the lower electrode. By introducing the third phase in which the RF power is not supplied, the amount of the byproduct in the plasma processing space 10s may be further decreased, and the etching accuracy in the vertical direction may be improved.

However, the embodiment is not limited to the waveform in FIG. 5, and the same effect may be obtained by modifications. In the following, modifications 1 to 5 will be described with reference to FIGS. 10 to 14.

Modification 1

Figure 10:
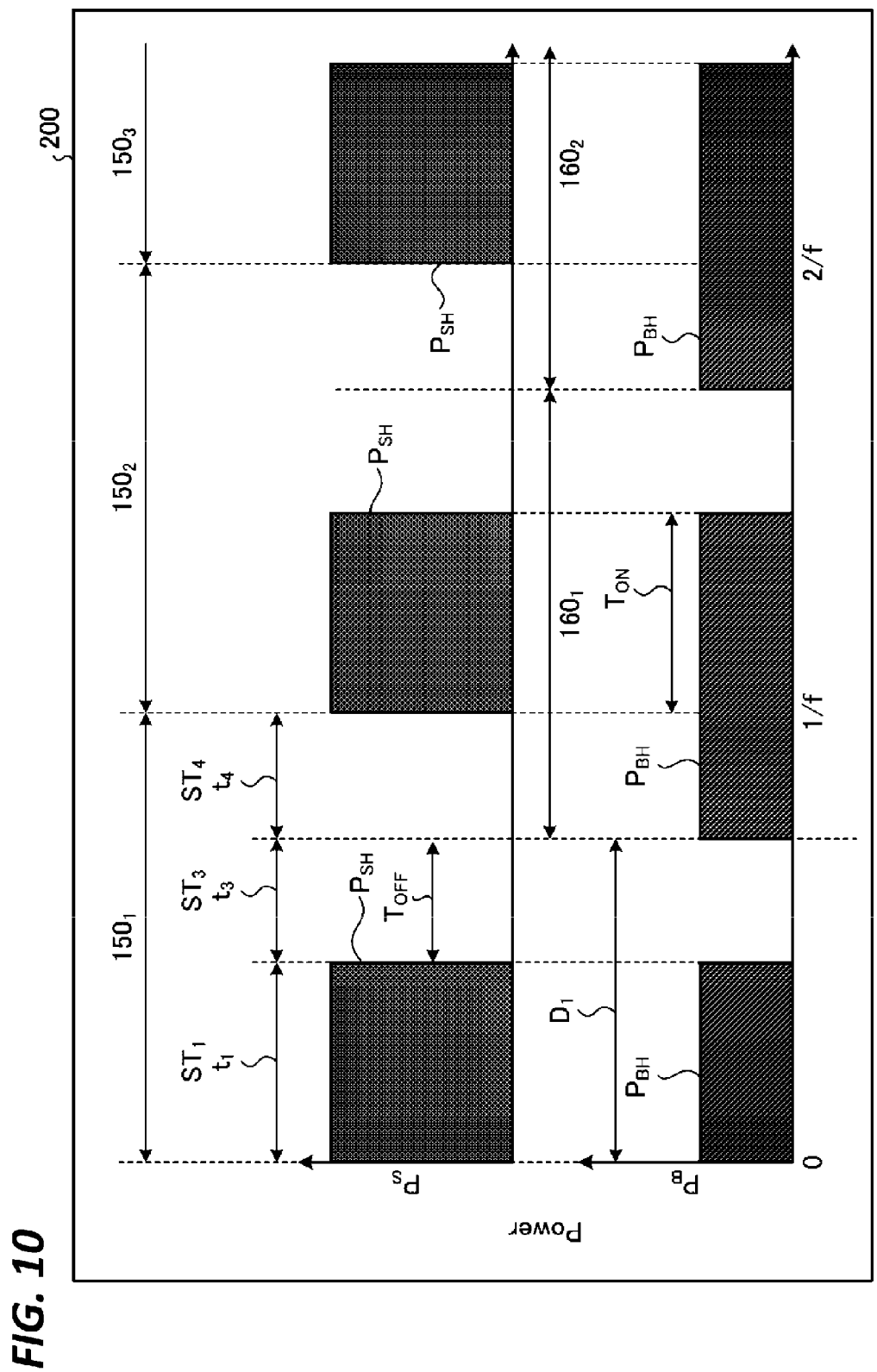
FIG. 10 is a view illustrating a waveform example of an RF signal used for RF power supply in the plasma processing according to Modification 1.

FIG. 10 is a view illustrating a waveform example of the RF signal used for RF power supply in the plasma processing according to Modification 1. A timing diagram 200 illustrated in FIG. 10 illustrates the source power $P_S$ and the bias power $P_B$. First, when the period $t_1$ is started, the source power $P_{SH}$ and the bias power $P_{BH}$ are applied. The source power $P_{SH}$ and the bias power $P_{BH}$ are superimposed and applied at a constant level through the period $t_1$. Next, when the period $t_3$ is reached, the supply of both the source power $P_S$ and the bias power $P_B$ is stopped (period $T_{OFF}$). Next, when the period $t_4$ is reached, the supply of the bias power $P_{BH}$ is started. Then, when the timing of the next cycle $150_2$ is reached, the supply of the source power $P_{SH}$ is started, and the source power $P_{SH}$ and the bias power $P_{BH}$ are superimposed and applied (period $T_{ON}$).

Unlike the waveform example in FIG. 5, in the timing diagram 200 in FIG. 10, the second phase, that is, a phase in which the supply of the source power $P_S$ is continued, and the supply of the bias power $P_B$ is stopped does not exist. Further, the timing diagram 200 in FIG. 10 does not have the fifth phase, that is, a phase in which the level of the bias power $P_B$ is changed before the supply of the source power $P_S$. As a result, Modification 1 may be applied to a case of pattern formation suitable for starting the exhaust of byproducts (third phase) without adjusting the amount of ions or radicals. Further, Modification 1 may be applied to a case where it is not necessary to generate ion energy before generating plasma.

Modification 2

Figure 11:
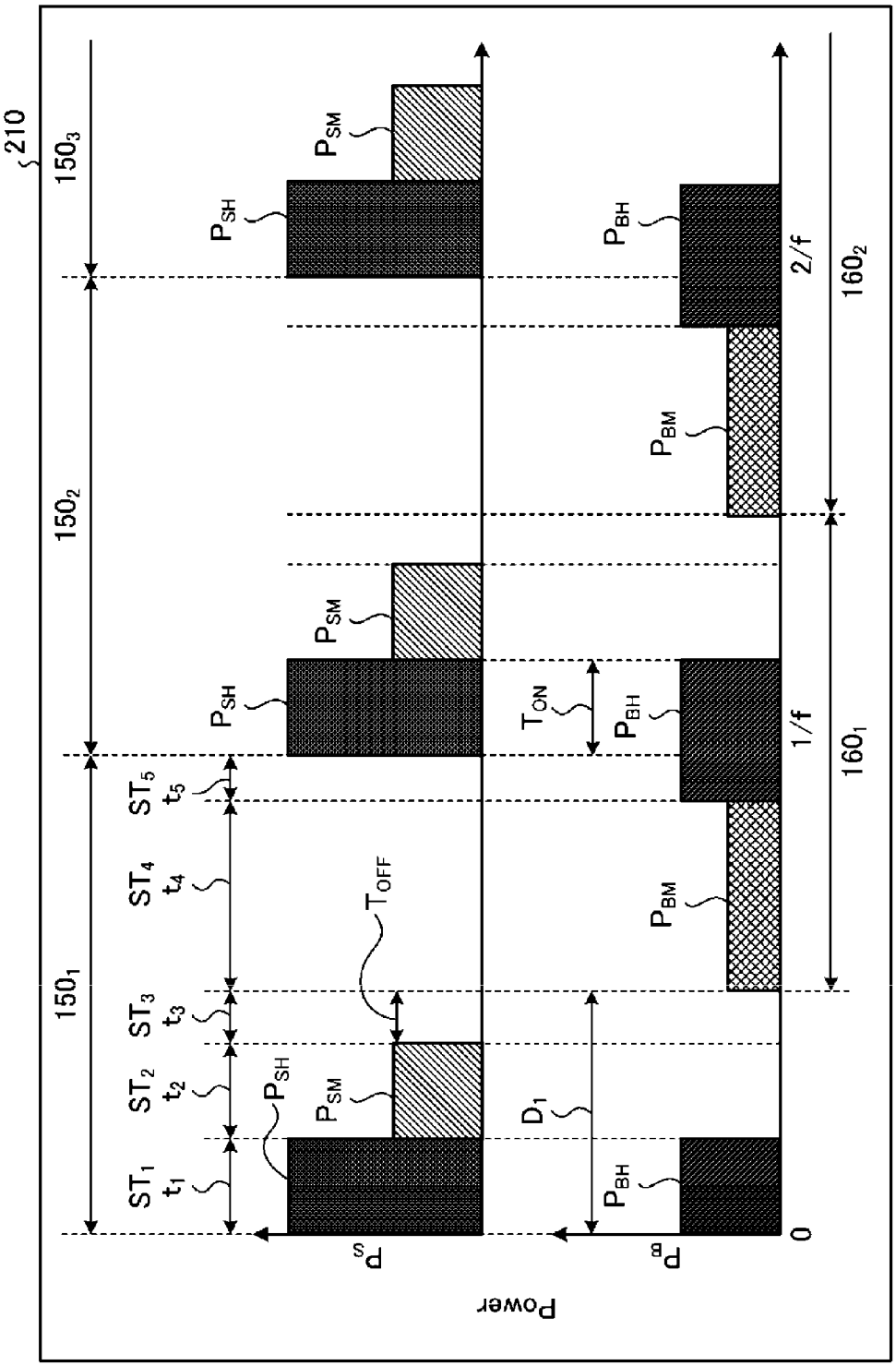
FIG. 11 is a view illustrating a waveform example of an RF signal used for RF power supply in the plasma processing according to Modification 2.

FIG. 11 is a view illustrating a waveform example of the RF signal used for RF power supply in the plasma processing according to Modification 2. First, in a timing diagram 210 illustrated in FIG. 11, in the period $t_1$, the source power $P_{SH}$ and the bias power $P_{BH}$ are applied. In the next period $t_2$, the level of the source power $P_S$ is changed from $P_{SH}$ to $P_{SM}$. Further, when the period $t_2$ is started, the supply of the bias power $P_{BH}$ is stopped. Next, when the period $t_3$ is reached, the supply of the source power $P_{SM}$ is stopped. As a result, during the period $t_3$, both the source power $P_S$ and the bias power $P_B$ are not supplied (period $T_{OFF}$). Then, when the period $t_4$ is reached, the supply of the bias power $P_{BM}$ is started. During the period $t_4$, the bias power $P_B$ at the level $P_{BM}$ is supplied. Then, when the period $t_5$ is reached, the level of the bias power $P_B$ is changed from $P_{BM}$ to $P_{BH}$. Then, when the next cycle $150_2$ is reached while the supply of the bias power $P_{BH}$ is continued, the source power $P_{SH}$ is supplied, and the source power $P_{SH}$ and the bias power $P_{BH}$ are superimposed and supplied (period $T_{ON}$).

Comparing to the waveform example in FIG. 5, Modification 2 is different in that the level of the source power $P_S$ is set $P_{SH}$ and $P_{SM}$. The level of the source power $P_S$ is set from a high level to a low level in the order of the levels $P_{SH}$, $P_{SM}$, and $P_{SL}$. Further, Modification 2 is different from the waveform example in FIG. 5 in that the level of the bias power $P_B$ is set $P_{BH}$ and $P_{BM}$. The level of the bias power $P_B$ is set from a high level to a low level in the order of the levels $P_{BH}$, $P_{BM}$, and $P_{BL}$. In the case of Modification 2, ON states of the source power $P_S$ and the bias power $P_B$ are set two levels. However, the lower level of the two levels is set to be a level higher than the case of the example in FIG. 5.

For example, when it is required to maintain, for example, electron density Ne, radical density Nr, electron temperature Te, and ion energy εi at a high level before and after the third phase in which byproducts are exhausted, the levels of a plurality of ON states of the source power $P_S$ and the bias power $P_B$ may be set to be high similar to Modification 2.

Also in Modification 2, as in the waveform example in FIG. 5, the rise of the bias RF signal is delayed by the period $D_1$ from the rise of the source RF signal. Further, the period $T_{OFF}$ in which both the source power $P_S$ and the bias power $P_B$ are not supplied exists. Further, the period $T_{ON}$ in which both the source power $P_S$ and the bias power $P_B$ are supplied exists. The period $T_{ON}$ is a period from the timing at which the source RF signal is raised to the timing at which the bias RF signal is fallen.

Modification 3

Figure 12:
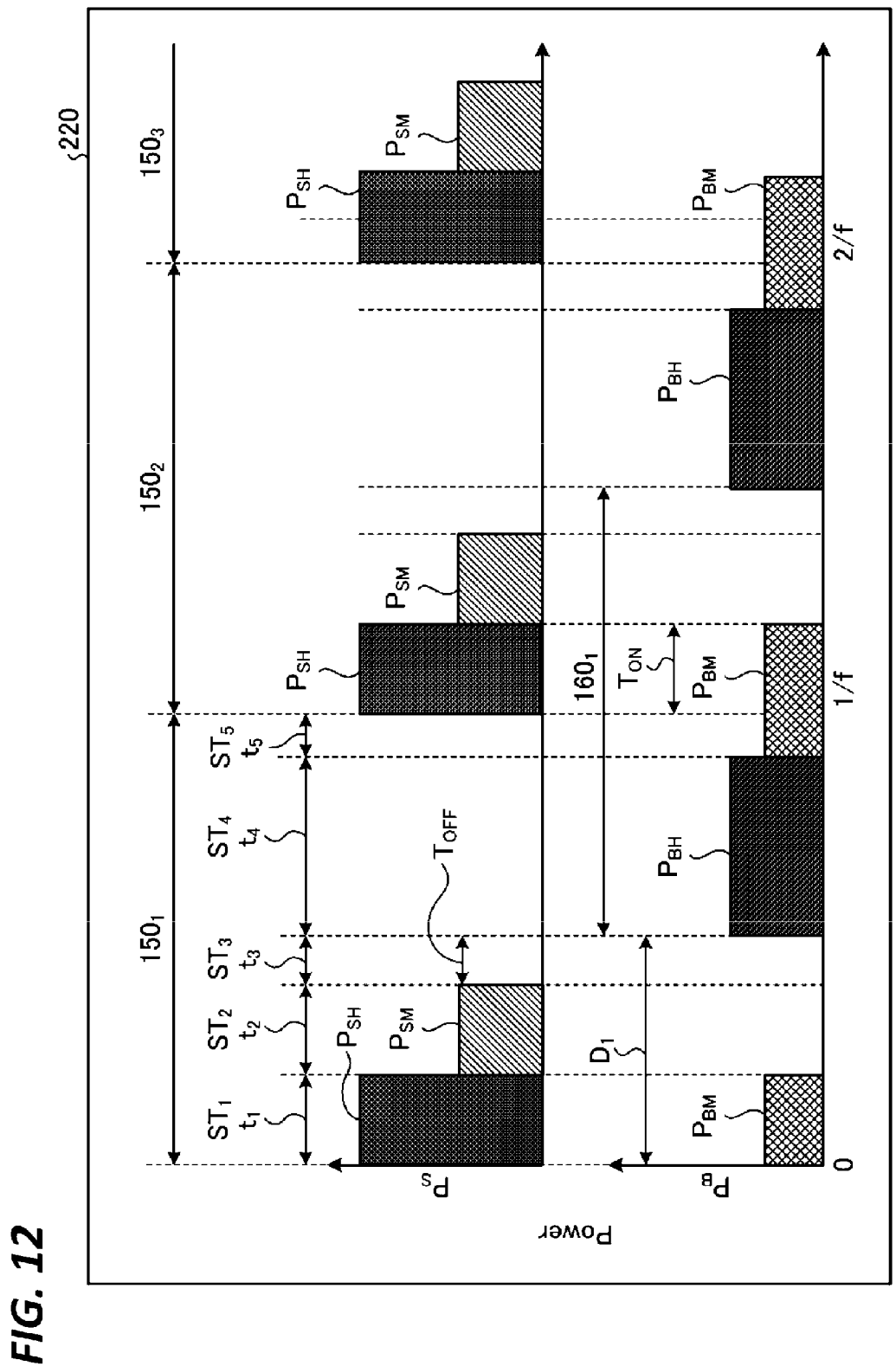
FIG. 12 is a view illustrating a waveform example of an RF signal used for RF power supply in the plasma processing according to Modification 3.

FIG. 12 is a view illustrating a waveform example of the RF signal used for RF power supply in the plasma processing according to Modification 3. First, in a timing diagram 220 illustrated in FIG. 12, in the period $t_1$, the source power $P_{SH}$ and the bias power $P_{BM}$ are supplied. Next, in the period $t_2$, the level of the source power $P_S$ is changed from $P_{SH}$ to $P_{SM}$. Further, when the period $t_2$ is reached, the supply of the bias power $P_{BM}$ is stopped. Next, when the period $t_3$ is reached, the supply of the source power $P_{SM}$ is stopped. During the period $t_3$, both the source power $P_S$ and the bias power $P_B$ are not supplied (period $T_{OFF}$). Then, in the period $t_4$, the supply of the bias power $P_{BH}$ is started. During the period $t_4$, the bias power $P_B$ at the level $P_{BH}$ is supplied. Then, when the period $t_5$ is reached, the level of the bias power $P_B$ is changed from $P_{BH}$ to $P_{BM}$. Then, when the cycle $150_2$ is started while the supply of the bias power $P_{BM}$ is continued, the source power $P_{SH}$ is supplied, and the source power $P_{SH}$ and the bias power $P_{BM}$ are superimposed and supplied (period $T_{ON}$).

Modification 3 is substantially the same as Modification 2 in FIG. 11. However, Modification 3 is different from Modification 2 in the transition order of the levels of the bias power $P_B$. In Modification 2, the levels of the bias power $P_B$ are $P_{BH}$ during the period $t_1$, $P_{BM}$ during the period $t_4$, and $P_{BH}$ during the period $t_5$. With regard to this, in Modification 3, the levels of the bias power $P_B$ are $P_{BM}$ during the period $t_1$, $P_{BH}$ during the period $t_4$, and $P_{BM}$ during the period $t_5$. In Modification 2, the level of the bias power $P_B$ is changed in the order of the high level, the OFF state, the low level, and the high level from the first phase to the fifth phase. With regard to this, in Modification 3, the level of the bias power $P_B$ is changed in the order of the low level, OFF state, the high level, and the low level from the first phase to the fifth phase.

For example, the waveform of Modification 3 is suitable for, for example, a case of the plasma processing suitable for drawing ions to the bottom portion of the recess OP by increasing ion energy in the third phase.

Modification 4

Figure 13:
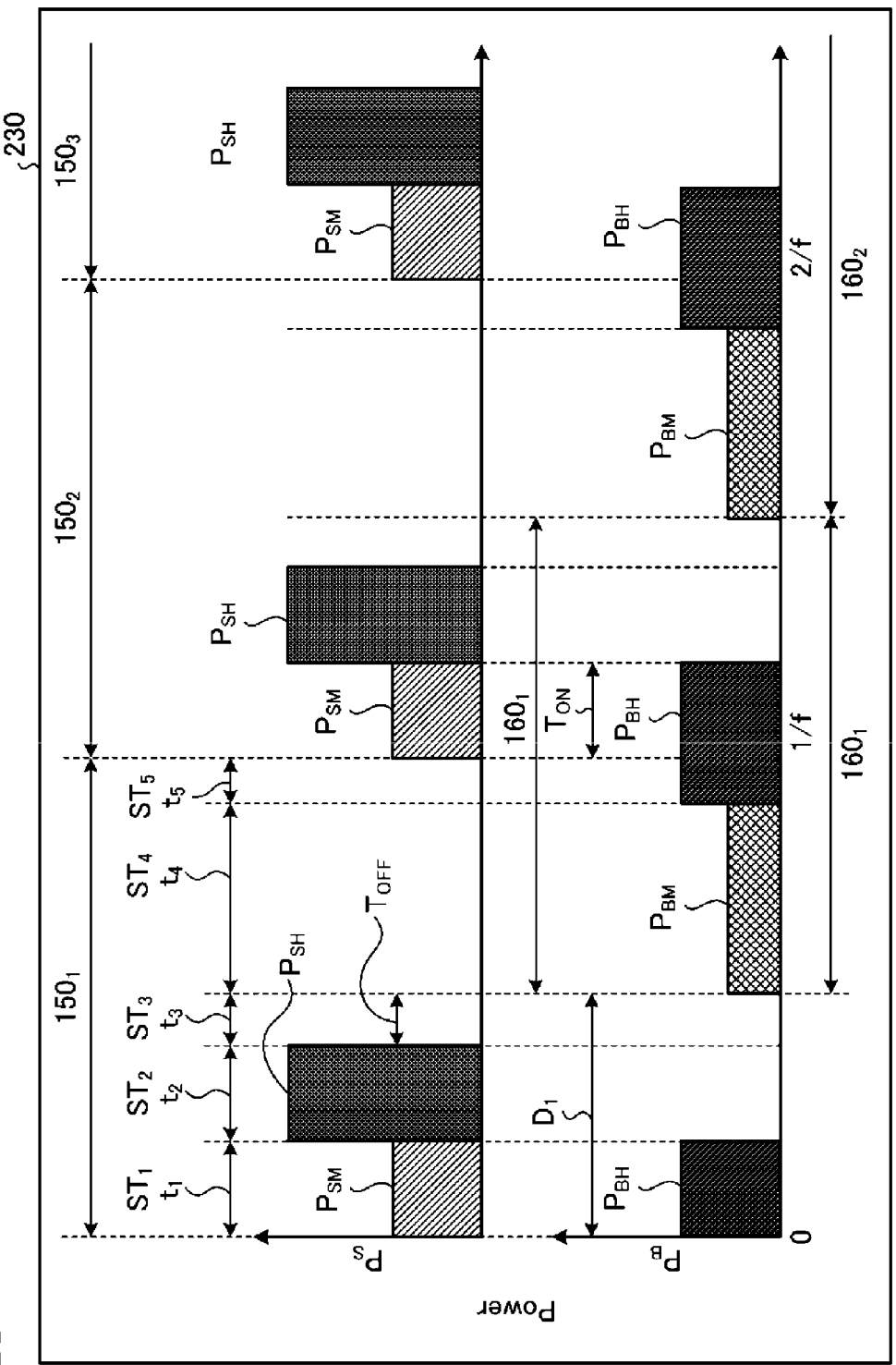
FIG. 13 is a view illustrating a waveform example of an RF signal used for RF power supply in the plasma processing according to Modification 4.

FIG. 13 is a view illustrating a waveform example of the RF signal used for RF power supply in the plasma processing according to Modification 4. First, in a timing diagram 230 illustrated in FIG. 13, in the period $t_1$, the source power $P_{SM}$ and the bias power $P_{BH}$ are applied. Next, in the period $t_2$, the level of the source power $P_S$ is changed from $P_{SM}$ to $P_{SH}$. Further, when the period $t_2$ is reached, the supply of the bias power $P_{BH}$ is stopped. Next, in the period $t_3$, the supply of the source power $P_{SH}$ is stopped. During the period $t_3$, both the source power $P_S$ and the bias power $P_B$ are not supplied (period $T_{OFF}$). Then, in the period $t_4$, the supply of the bias power $P_{BM}$ is started. During the period $t_4$, the bias power $P_B$ at the level $P_{BM}$ is supplied. Then, when the period $t_5$ is reached, the level of the bias power $P_B$ is changed from $P_{BM}$ to $P_{BH}$. Then, when the next cycle 150₂ is reached while the supply of the bias power $P_{BH}$ is continued, the source power $P_{SM}$ is supplied, and the source power $P_{SM}$ and the bias power $P_{BH}$ are superimposed and supplied (period $T_{ON}$).

Modification 4 is substantially the same as Modification 2 in FIG. 11. However, Modification 4 is different from Modification 2 in the transition order of the levels of the source power $P_S$. In Modification 2, the levels of the source power $P_S$ is $P_{SH}$ during the period $t_1$, and $P_{SM}$ during the period $t_2$. With regard to this, in Modification 4, the levels of the source power $P_S$ is $P_{SM}$ during the period $t_1$, and $P_{SH}$ during the period $t_2$. In Modification 2, the level of the source power $P_S$ is changed in the order of high, low, and OFF from the first phase to the third phase, and is not changed from the third phase to the fourth phase. With regard to this, in Modification 4, the level of the source power $P_S$ is changed in the order of low, high, and OFF from the first phase to the third phase, and is not changed from the third phase to the fourth phase.

Modification 4 is suitable for, for example, a processing required to gradually increase the amounts of ions and radicals instead of rapidly increasing the amounts of ions and radicals in the first phase.

Modification 5

Figure 14:
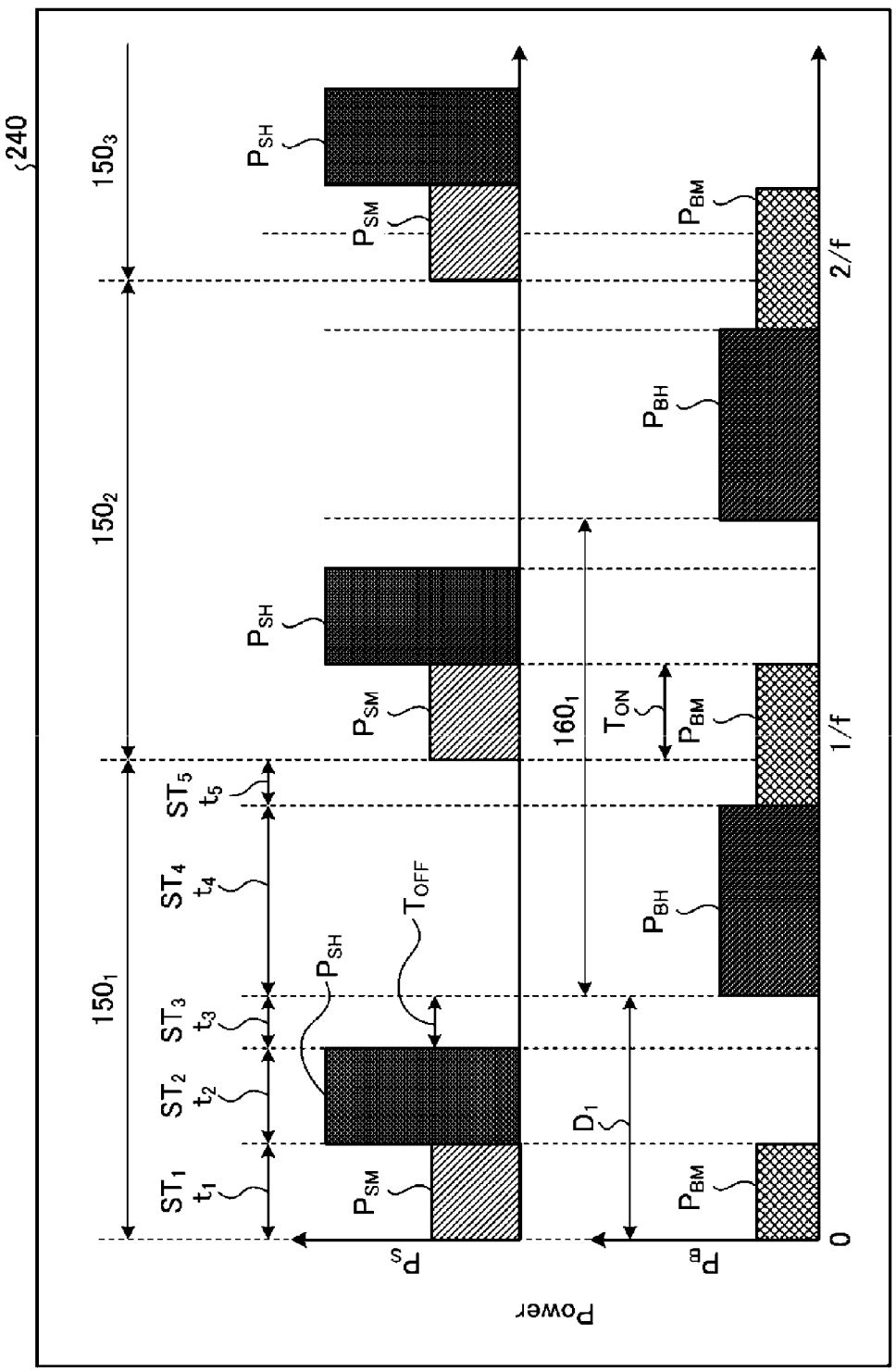
FIG. 14 is a view illustrating a waveform example of an RF signal used for RF power supply in the plasma processing according to Modification 5.

FIG. 14 is a view illustrating a waveform example of the RF signal used for RF power supply in the plasma processing according to Modification 5. First, in a timing diagram 240 illustrated in FIG. 14, in the period $t_1$, the source power $P_{SM}$ and the bias power $P_{BM}$ are applied. Next, when the period $t_2$ is reached, the level of the source power $P_S$ is changed from $P_{SM}$ to $P_{SH}$. Further, when the period $t_2$ is reached, the supply of the bias power $P_{BM}$ is stopped. Next, when the period $t_3$ is reached, the supply of the source power $P_{SH}$ is stopped. During the period $t_3$, both the source power $P_S$ and the bias power $P_B$ are not supplied (period $T_{OFF}$). Then, when the period $t_4$ is reached, the supply of the bias power $P_{BH}$ is started. During the period $t_4$, the bias power $P_B$ at the level $P_{BH}$ is supplied. Then, when the period $t_5$ is reached, the level of the bias power $P_B$ is changed from $P_{BH}$ to $P_{BM}$. Then, when the next cycle 150₂ is reached while the supply of the bias power $P_{BM}$ is continued, the source power $P_{SM}$ is supplied, and the source power $P_{SM}$ and the bias power $P_{BM}$ are superimposed and supplied (period $T_{ON}$).

Modification 5 is a waveform obtained by combining the bias power $P_B$ of Modification 3 in FIG. 12 and the source power $P_S$ of Modification 4 in FIG. 13. The bias power $P_B$ of Modification 3 is changed in the order of the low level (first phase), the OFF state (second and third phases), the high level (fourth phase), and the low level (fifth phase) from the first phase to the fifth phase. Further, the source power $P_S$ of Modification 4 is changed in the order of the low level (first phase), the high level (second phase), and the OFF state (third to fifth phases) from the first phase to the fifth phase. As a result, in the waveform of Modification 5, $\{P_S, P_B\}$ is changed in the order of $\{P_{SM}, P_{BM}\}$, $\{P_{SH}, P_{BOFF}\}$, $\{P_{SOFF}, P_{BOFF}\}$, $\{P_{SOFF}, P_{BH}\}$, and $\{P_{SOFF}, P_{BM}\}$ from the first phase to the fifth phase. Here, when the ON state has two levels in one waveform, one is called a high level, and the other is called a low level, and any level is called a middle level. Further, the OFF state of the source power $P_S$ is indicated by $P_{SOFF}$, and the OFF state of the bias power $P_B$ is indicated by $P_{BOFF}$.

Modification 5 is suitable for, for example, a processing required to etch after raising ion energy once and then lowering the ion energy in the fourth phase.

Flow of RF Power Supply

Figure 15:
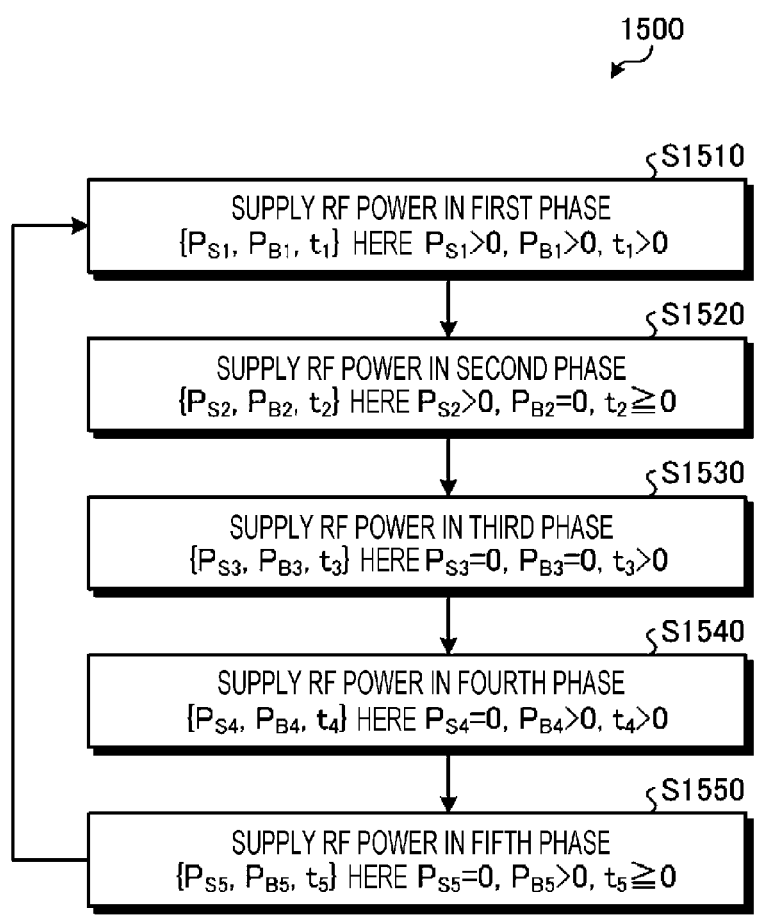
FIG. 15 is a flowchart illustrating an example of a flow of the RF power supply of the plasma processing according to the embodiment.

FIG. 15 is a flowchart illustrating an example of a flow of the RF power supply of the plasma processing according to the embodiment. A flow 1500 illustrated in FIG. 15 is executed in step S32 in FIG. 3.

First, the RF power supply 31 executes the RF power supply in the first phase under the control of the controller (step S1510). The RF power supply in the first phase is defined by a first set processing parameter $\{P_{S1}, P_{B1}, \text{and } t_1\}$. Here, $P_{S1}>0$, $P_{B1}>0$, and $t_1>0$.

Next, the RF power supply 31 executes the RF power supply in the second phase under the control of the controller (step S1520). The RF power supply in the second phase is defined by a second set processing parameter $\{P_{S2}, P_{B2}, \text{and } t_2\}$. Here, $P_{S2}>0$, $P_{B2}=0$, and $t_2 \le 0$.

Next, the RF power supply 31 executes the RF power supply in the third phase under the control of the controller (step S1530). The RF power supply in the third phase is defined by a third set processing parameter $\{P_{S3}, P_{B3}, \text{and } t_3\}$. Here, $P_{S3}=0$, $P_{B3}=0$, and $t_3>0$.

Next, the RF power supply 31 executes the RF power supply in the fourth phase under the control of the controller (step S1540). The RF power supply in the fourth phase is defined by a fourth set processing parameter $\{P_{S4}, P_{B4}, \text{and } t_4\}$. Here, $P_{S4}=0$, $P_{B4}>0$, and $t_4>0$.

Next, the RF power supply 31 executes the RF power supply in the fifth phase under the control of the controller (step S1550). The RF power supply in the fifth phase is defined by a fifth set processing parameter $\{P_{S5}, P_{B5}, \text{and } t_5\}$. Here, $P_{S5}=0$, $P_{B5}>0$, and $t_5 \le 0$.

Steps S1510 to S1540 are executed as one cycle. After step S1540, the processing may return to step S1510 continuously, and the cycle may be executed again.

Figure 16:
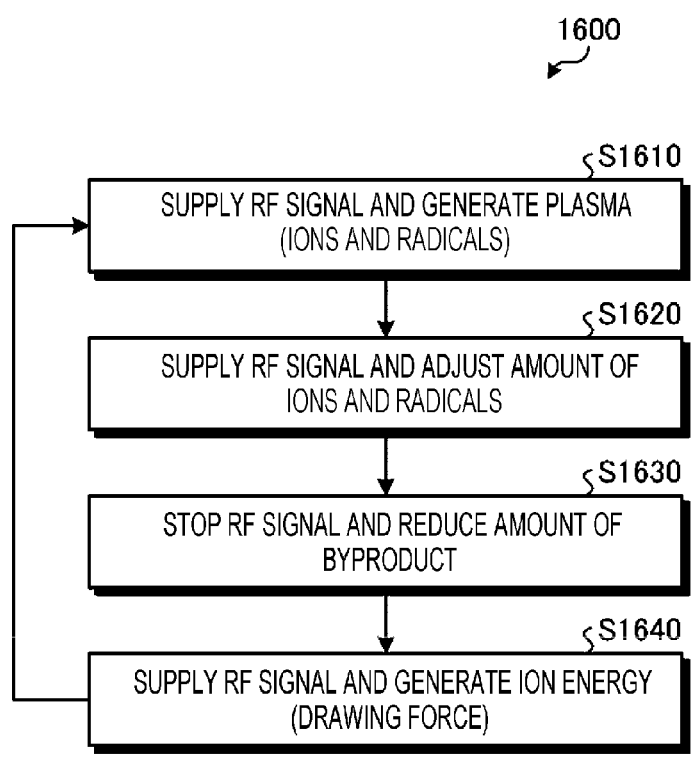
FIG. 16 is a flowchart illustrating another example of a flow of the RF power supply of the plasma processing according to the embodiment.

FIG. 16 is a flowchart illustrating another example of the flow of the RF power supply of the plasma processing according to the embodiment. A flow 1600 illustrated in FIG. 16 is executed in step S32 in FIG. 3.

First, the RF power supply 31 supplies the source power $P_S$ to the antenna (coil) 14, and supplies the bias power $P_B$ to the lower electrode at the same time under the control of the controller. Therefore, plasma is generated in the plasma processing space 10s. Further, the plasma includes ions and radicals (step S1610).

Next, the RF power supply 31 stops the supply of the bias power $P_B$ to the lower electrode under the control of the controller. Further, the RF power supply 31 changes the value of the source power $P_S$ supplied to the antenna (coil) 14. For example, the RF power supply 31 decreases or increases the source power $P_S$. Therefore, the RF power supply 31 adjust the amounts of the ions and the radicals included in the plasma in the plasma processing space 10s (step S1620).

Next, under the control of the controller, the RF power supply 31 stops the supply of the source power $P_S$ to the coil while the supply of the bias power $P_B$ to the lower electrode is stopped. Then, the amount of the byproduct in the plasma processing space 10s is decreased by the exhaust processing of the plasma processing space 10s by the exhaust system 40 (step S1630).

Next, the RF power supply 31 supplies bias power $P_B$ to the lower electrode under the control of the controller. The supply of the source power $P_S$ remains stopped. A drawing force to the lower electrode by the bias power $P_B$ is generated (step S1640).

Steps S1610 to S1640 are executed as one cycle. After step S1640, the processing may return to step S1510 continuously, and the cycle may be executed again.

A part of the above embodiment and Modifications may be appropriately modified. Considered modified aspects are disclosed in the following.

Other Embodiment

The source power $P_S$ may be alternating current (AC) power. Further, the source power $P_S$ may be radio frequency (RF) power or very high frequency (VHF) power. The source power $P_S$ may be, for example, RF power in a range of approximately 60 MHz to approximately 200 MHz. Further, the source power $P_S$ may be, for example, RF power in a range of approximately 25 MHz to approximately 60 MHz. The source power $P_S$ may be, for example, 27 MHz. In the embodiment, the source power $P_S$ generates inductively coupled plasma (ICP). For example, the source power $P_S$ combines with a helical antenna to generate plasma.

The bias power $P_B$ may be alternating current (AC) power. Further, the bias power $P_B$ may be direct current (DC) pulse power. The bias power $P_B$ may be any one of radio frequency (RF) power, high frequency (HF) power, and medium frequency (MF) power. The bias power $P_B$ may be, for example, power having a frequency in a range of approximately 200 kHz to approximately 600 kHz. The bias power $P_B$ may be, for example, 400 kHz. Further, the bias power $P_B$ may be, for example, power in a range of approximately 600 kHz to approximately 13 MHz.

The source power $P_S$ and the bias power $P_B$ may be applied as a single pulse or as a continuous pulse in each cycle, respectively. For example, in the first phase, the source power $P_{S1}$ applied in the period $t_1$ may be a single pulse or a continuous pulse. In the same manner, the bias power $P_{B2}$ applied in the period $t_2$ may be a single pulse or a continuous pulse.

The duty ratios of the source RF signal and the bias RF signal may be individually set in a range of approximately 3% to approximately 90%.

For example, in a case of a three-level waveform, the duty ratio of the ON state at a high level of the source RF signal may be set in a range of approximately 5% to approximately 50%. Further, the duty ratio of the ON state at a low level of the source RF signal may be set in a range of approximately 0% to approximately 45%. Further, the duty ratio of the OFF state of the source RF signal may be set in a range of approximately 5% to approximately 90%.

Further, the duty ratio of the ON state at a high level of the bias RF signal may be set in a range of approximately 5% to approximately 50%. Further, the duty ratio of the ON state at a low level of the bias RF signal may be set in a range of approximately 0% to approximately 45%. Further, the duty ratio of the OFF state of the bias RF signal may be set in a range of approximately 5% to approximately 90%.

Further, the length of the period during which the source RF signal and the bias EF signal are OFF states at the same time may be set in a range of the duty ratio of approximately 5% to approximately 90%. This period may be set, for example, in a range of approximately 0 microseconds to approximately 500 microseconds, and further, in a range of approximately 10 microseconds to approximately 50 milliseconds. Further, in this period, the duty ratios of the source RF signal and the bias RF signal may be set in a range of approximately 10% to approximately 50%.

A gas is supplied to the plasma processing chamber 10 at a flow rate selected according to a predetermined plasma processing. The gas is supplied to the plasma processing chamber 10 at substantially the same flow rate during one cycle including the first phase, the second phase, the third phase, the fourth phase, and the fifth phase. The supplied gas includes, for example, hydrogen bromide (HBr). Further, the supplied gas includes, for example, a rare gas such as helium (He) or argon (Ar). Further, the supplied gas may include, for example, oxygen ($O_2$), tetrafluoromethane ($CF_4$), nitrogen trifluoride ($NF_3$), sulfur hexafluoride ($SF_6$), chlorine ($Cl_2$), and tetrachloromethane ($CCl_4$).

The byproduct generated during the plasma processing according to the embodiment may be a compound containing the gas in the plasma processing chamber 10 and one or more kinds of elements contained in the composition of the substrate. For example, when a silicon substrate and HBR gas are used, the byproduct containing SiBrx may be produced. Additionally, for example, silicon-containing residues such as silicon fluoride (SiFx) or silicon chloride (SiClx), or carbon-containing residues such as fluorocarbon (CFx) or hydrofluorocarbon (CHxFy) (in a case of a processing using a photoresist, an organic film, or a precursor) may be produced as a byproduct.

Effect of Embodiment

As described above, the plasma processing apparatus according to the embodiment includes the plasma processing chamber, the substrate support, the source RF generator, and the bias RF generator. The substrate support is disposed in the plasma processing chamber. The source RF generator is coupled to the plasma processing chamber, and is configured to generate a pulse source RF signal including a plurality of source cycles. Each source cycle has a source operating state during a source operating period and a source non-operating state during a source non-operating period after the source operating period. The bias RF generator is coupled to the substrate support, and is configured to generate a pulse bias RF signal. The pulse bias RF signal has a plurality of bias cycles having the same pulse frequency as the plurality of source cycles. Each bias cycle has a bias operating state during a bias operating period and a bias non-operating state during a bias non-operating period after the bias operating period. A transition timing to the bias operating state in each bias cycle is delayed with respect to a transition timing to the source operating state in the corresponding source cycle. The source OFF period overlaps with the bias non-operating period. The bias operating period in each bias cycle overlaps with the source operating period in the next source cycle. As described above, the plasma processing apparatus supplies the RF signal so that the cycles of the pulse source RF signal and the pulse bias signal are deviated. Further, the plasma processing apparatus supplies the RF signal so that the bias operating period lasts over two cycles of the pulse source RF signal. As a result, the plasma processing apparatus may improve the performance of the plasma etching by finely controlling, for example, ion energy generated during the plasma etching. Further, the source operating period and the bias operating period are deviated, and thus, the plasma processing apparatus may set the power level supplied at the rise (at the start of the cycle) of the pulse source RF signal to be high. As a result, the plasma processing apparatus may implement efficient plasma etching.

As described above, in the plasma processing apparatus according to the embodiment, the source operating state may have at least two source power levels. Further, the bias operating state may have at least two bias power levels.

As described above, in the plasma processing apparatus according to the embodiment, the source operating state may have a first source power level and a second source power level after the first source power level. The bias operating state may have a first bias power level and a second bias power level after the first bias power level. The pulse bias RF signal may transition to the bias operating state during the source non-operating period in each source cycle.

As described above, in the plasma processing apparatus according to the embodiment, the bias RF signal may transition from the first bias power level to the second bias power level during the source non-operating period in each source cycle.

As described above, in the plasma processing apparatus according to the embodiment, a transition from the first source power level to the second source power level in each source cycle may be substantially synchronized with a transition from the bias operating state to the bias non-operating state in each bias cycle.

As described above, in the plasma processing apparatus according to the embodiment, the first source power level may be larger than the second source power level.

As described above, in the plasma processing apparatus according to the embodiment, the first source power level may be smaller than the second source power level.

As described above, in the plasma processing apparatus according to the embodiment, the second bias power level may be larger than the first bias power level.

As described above, in the plasma processing apparatus according to the embodiment, the second bias power level may be smaller than the first bias power level.

Further, the plasma processing method according to the embodiment may be a plasma processing method used in a plasma processing apparatus. The plasma processing apparatus may include a plasma processing chamber, an antenna, a first RF generator, a substrate support, and a second RF generator. The antenna may be disposed above the plasma processing chamber. The first RF generator may be coupled to the antenna and generate a first RF power. The substrate support may be disposed in the plasma processing chamber. The second RF generator may be coupled to the substrate support and generate a second RF power. The plasma processing method may include supplying the first RF power to the antenna and supplying the second RF power to the substrate support in a first period. Further, the plasma processing method may include supplying the first RF power to the antenna and stopping the supply of the second RF power to the substrate support in a second period after the first period. Further, the plasma processing method may include stopping the supply of the first RF power to the antenna and stopping the supply of the second RF power to the substrate support in a third period after the second period. Further, the plasma processing method may include supplying the second RF power to the substrate support without supplying the RF power to the antenna in a fourth period after the third period. Then, the plasma processing method may repeatedly execute each step.

It should be considered that the embodiments disclosed in here are exemplary and not restrictive in all aspects. The above-described embodiments may be omitted, replaced, or changed in various forms without departing from the scope of claims and the gist thereof. For example, in the above embodiments, the plasma processing method executed using an inductively-coupled plasma apparatus has been described as an example. However, the disclosed technology is not limited thereto, and may also be applied to a plasma processing method using another plasma processing apparatus. For example, a capacitively-coupled plasma (CCP) apparatus may be used instead of an inductively-coupled plasma apparatus. In this case, the capacitively-coupled plasma apparatus includes two facing electrodes disposed in the plasma processing chamber. In the embodiment, one electrode is disposed in the substrate support, and the other electrode is disposed above the substrate support. In this case, one electrode functions as a lower electrode, and the other electrode functions as an upper electrode. Then, the source RF generator 31a and the bias RF generator 31b are coupled to at least one of the two facing electrodes. In the embodiment, the source RF generator 31a is coupled to the upper electrode, and the bias RF generator 31b is coupled to the lower electrode. The source RF generator 31a and the bias RF generator 31b may be coupled to the lower electrode.

According to the present disclosure, the processing performance of the plasma etching may be improved.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus, comprising:
a plasma processing chamber;
a substrate support disposed in the plasma processing chamber;
a source radio frequency (RF) generator coupled to the plasma processing chamber;
a bias RF generator coupled to the substrate support;
at least one memory storing executable instructions; and
at least one processor configured to execute the executable instructions to:
control the source RF generator to generate a pulse source RF signal including a plurality of source cycles, each source cycle of the plurality of source cycles having:
a source operating state during a source operating period in which the pulse source RF signal is turned ON to a first source power level and then to a second source power level lower than the first source power level, and
a source non-operating state during a source non-operating period in which the pulse source RF signal is turned OFF, the source non-operating period being after the source operating period;
control the bias RF generator to generate a pulse bias RF signal including a plurality of bias cycles having a same pulse frequency as that of the plurality of source cycles, each bias cycle of the plurality of bias cycles having:
a bias operating state during a bias operating period in which the pulse bias RF signal is turned ON to a first bias power level and then to a second bias power level higher than the first bias power level, and
a bias non-operating state during a bias non-operating period in which the pulse bias RF signal is turned OFF, the bias non-operating period being after the bias operating period; and control the source RF generator and the bias RF generator such that:

a transition timing to the bias operating state in each bias cycle is delayed with respect to a transition timing to the source operating state in a corresponding source cycle, the source non-operating period partially overlaps with the bias non-operating period, and the bias operating period in each bias cycle partially overlaps with the source operating period in a next source cycle such that the bias operating period in one bias cycle lasts over two source cycles of the pulse source RF signal.

2. The plasma processing apparatus according to claim 1, wherein the pulse bias RF signal transitions to the bias operating state during the source non-operating period in each source cycle.

3. The plasma processing apparatus according to claim 2, wherein the pulse bias RF signal transitions from the first bias power level to the second bias power level during the source non-operating period in each source cycle.

4. The plasma processing apparatus according to claim 3, wherein a transition from the first source power level to the second source power level in each source cycle is substantially synchronized with a transition from the bias operating state to the bias non-operating state in each bias cycle.

5. The plasma processing apparatus according to claim 2, wherein a transition from the first source power level to the second source power level in each source cycle is substantially synchronized with a transition from the bias operating state to the bias non-operating state in each bias cycle.

6. The plasma processing apparatus according to claim 1, wherein the at least one processor is configured to execute the executable instructions to control the source RF generator and the bias RF generator such that:

a period having the first source power level partially overlaps with a period having the second bias power level in a period during which the bias operating period in one bias cycle lasts over the two source cycles of the pulse source RF signal.

* * * * *